United States Patent
Yang et al.

(10) Patent No.: US 10,739,427 B1
(45) Date of Patent: Aug. 11, 2020

(54) GRADIENT COIL WITH EXTERNAL DIRECT COOLING FOR BRAIN MAGNETIC RESONANCE IMAGING

(71) Applicants: UNIVERSITY OF MARYLAND, COLLEGE PARK, College Park, MD (US); THE UNITED STATES OF AMERICA, as represented by the Secretary, Department of the Health and Human Services, Bethesda, MD (US)

(72) Inventors: Bao Yang, Ellicott City, MD (US); Hanbing Lu, Ellicott City, MD (US); Zhi Yang, Danbury, CT (US)

(73) Assignees: University of Maryland, College Park, MD (US); The United States of America, as represented by the Secretary, Department of Health and Human Services, Bethesda, MD (US)

( * ) Notice: Subject to any disclaimer, the term of this patent is extended or adjusted under 35 U.S.C. 154(b) by 0 days.

(21) Appl. No.: 16/239,747

(22) Filed: Jan. 4, 2019

Related U.S. Application Data

(60) Provisional application No. 62/613,597, filed on Jan. 4, 2018.

(51) Int. Cl.
*G01R 33/385* (2006.01)

(52) U.S. Cl.
CPC ..... *G01R 33/3856* (2013.01); *G01R 33/3858* (2013.01)

(58) Field of Classification Search
CPC .......................... G01R 33/3856; G01R 33/3858
USPC .................................................. 324/319, 322
See application file for complete search history.

(56) References Cited

U.S. PATENT DOCUMENTS

| 5,378,989 A | 1/1995 | Barber et al. |
| 2012/0032679 A1 | 2/2012 | Brereton et al. |
| 2016/0178718 A1* | 6/2016 | Bindseil ................. H01F 41/04 324/322 |

\* cited by examiner

Primary Examiner — Farhana A Hoque
(74) Attorney, Agent, or Firm — Rosenberg, Klein & Lee

(57) ABSTRACT

The gradient coil assembly is designed to address a neck-shoulder clearance problem by configuring the coil holder housing with a cylindrical portion modified with a slanted surface and positioning current return elements of the coil pattern at the slanted surface, while positioning the active electrical elements on the cylindrical surface, thus eliminating influence of an undesired magnetic field generated by the current return elements, shortening the coil, and moving the homogeneous field gradient region toward the end of the cylindrical portion of the bore in the coil holder housing. The subject assembly operation is further improved by the direct external cooling approach, where a coolant flows in direct contact with electrical wires of the gradient coil inside the cooling channels in the surface of the coil holder housing.

17 Claims, 11 Drawing Sheets

GRADIENT COIL WITH EXTERNAL DIRECT COOLING FOR BRAIN MAGNETIC RESONANCE IMAGING

REFERENCE TO RELATED APPLICATIONS

This Utility Patent Application is based on the Provisional Patent Application Ser. No. 62/613,597, filed on 4 Jan. 2018.

FIELD OF THE INVENTION

The present invention is directed to medical equipment, and specifically, to a gradient coil design for Magnetic Resonance Imaging (MM) scanners.

More in particular, the present invention is directed to a gradient coil for MRI scanners having an improved wiring pattern, adapted for a patient's head MRI scanning, and equipped with an enhanced cooling design to permit operation with a high current density in the gradient coil, thus substantially increasing the magnetic field strength and homogeneity.

The present invention is also directed to a short gradient coil for MRI scanners specifically configured for brain imaging which is capable of attaining positioning of the head within the magnet bore of the MM scanner in alignment with the homogeneous magnetic field region generated by the gradient coil thus overcoming the neck-shoulder clearance problem found in contemporary MM scanners.

The present invention is further directed to a gradient coil for MM scanners which is secured to a coil holder housing configured with a cylindrically shaped body modified by attaching (to one or both ends thereof) a conically shaped extension member formed with a slanted wall of a predetermined radial length, where the slanted wall is angled with respect to the surface of the cylindrically shaped body to correlate to the anatomical angle between the neck and the shoulders of a patient. With such a configuration, the gradient coil holder housing with the slanted surface(s) overcomes the neck-shoulder clearance problem of conventional MRI brain scanners, allows passage of the patient's shoulders deeper into the gradient coil, and thus permits positioning of a patient's head further in depth of the gradient coil to coincide with the region of the most homogeneous magnetic field generated by the gradient coil, which is extremely beneficial for the resolution and sensitivity of the Mill imaging and for minimizing image distortion.

In addition, the present invention is directed to a gradient coil for MRI scanners where the return paths of the coil (which generate an undesired magnetic field) are positioned on a slanted wall of the conically shaped extension member of the gradient coil holder housing further away from the active coil portion, thus weakening the influence of the unwanted stray magnetic field generated by the return paths. This results in a stronger and more homogeneous field, a faster switching of the coil, and reducing the risk of an unwanted peripheral neurostimulation and electrocardiac stimulation of a patient.

Furthermore, the present invention is directed to a gradient coil system for MM scanners equipped with an external direct cooling system, where the heat transfer fluid flows inside a number of cooling channels formed in the external surface of the gradient coil holder housing in direct contact with the electrical conductors forming the gradient coils. This eliminates the thermal resistance between the coolant medium and the heated electrical conductors, attaining a controllable large contact area for the heat transfer and a low pressure drop between the coolant reservoir and the cooling channels, resulting in a low pump power requirements, and providing a uniform highly efficient cooling of the gradient coil with an improved coolant distribution.

BACKGROUND OF THE INVENTION

Gradient coils constitute a major piece of hardware in modern Magnetic Resonance Imaging (MM) scanners. Gradient coils are particularly important in studies which explore brain structural connectivity, due to the fact that an insufficient magnetic field strength generated by a gradient coil may limit the imaging resolution and sensitivity that may be achievable in the MM scanners. Thus, the magnetic field strength and slew rate (i.e., the speed of the coil switching) of a gradient coil have been important elements in evaluating the capacity of MRI scanners.

The performance of the gradient coil is one of the primary limiting factors in high speed, high resolution magnetic resonance imaging (MRI), and in diffusion MRI. There has been a consistent drive for higher magnetic field strength to achieve higher signal-to-noise ratio and stronger magnetic susceptibility effects, from which neuroimaging benefits the most. Optimal gradient performance is considered a prerequisite to attain the full potential of ultrahigh field magnetic resonance imaging (MRI).

The benefits of using tailored gradient coils for human brain imaging have been well acknowledged. Unfortunately, conventional head-only gradient coils have two major technical limitations, including (a) a limited neck-shoulder clearance and (b) a limited cooling capacity.

Theoretical analyses suggest that, for a cylindrical gradient coil having a radius R, the gradient strength scales roughly 1/R, and the inductance scales about $R^5$. Due to the fact that conventional MM scanners are designed to cover a large field of view, the gradient strength and the inductance of these coils are thus inherently limited by the physical size of the coil.

In addition, increasing the electrical current and voltage of a gradient amplifier output has been a major technical pursuit to enhance gradient performance. However, as the electrical current in the coil increases, the ohmic heating also becomes more pronounced. Thus, efficient cooling is needed for heat dissipation which is critical for the operation of the gradient coils.

Furthermore, the peripheral nerve stimulation (PNS) and the cardiac stimulation (CS) are two physiological factors that ultimately limit the performance of a gradient coil. PNS and CS thresholds are dB/dt related, where B is the magnetic field strength, which can be expressed as $\int \gamma G(r) dr$, where G is the gradient field along the coil length r. For a body gradient coil, G typically extends to a large distance r, and thus possesses a high risk to induce PNS and CS. It is thus suboptimal, for considerations, to employ a long whole-body gradient coil to image the brain.

To overcome the use of a long whole-body coil in brain imaging, a functional MRI technology has been developed in the form of a local gradient insert which enabled a fast imaging sequence, such as the echo planar imaging and the high resolution MM, to be implemented on clinical scanners. Nevertheless, despite MRI technology advancement, there are still two major technical issues associated with the conventional gradient insert design which include: a) the "shoulder clearance" issue and (b) cooling.

Regarding the "shoulder clearance", in conventional cylindrical coil design, the coil has to reach a certain length in order to achieve a volume with high fidelity to the linear gradient field suitable for human brain imaging. However, since the inner diameter of the cylindrical coil does not provide clearance for the shoulders of a typical adult, one cannot place the center of the human brain at the center of the gradient coil where a uniform magnetic field is produced. As depicted in FIG. 1, the head of the human patient is displaced from the center of the gradient coil featuring the uniform region of the magnetic field. Due to this displacement, disadvantageously, only a fraction of the "sweet spot" (i.e., the uniform region) is used for neuroimaging.

Regarding the cooling issue, modern gradient amplifiers which are capable of providing a current value of 600 amperes, or more, are needed in the gradient coil and are readily available.

However, the high current used in the operation of this gradient coil generates a large amount of heat. For example, for a resistance of 0.5 ohm, with a current of 600 amperes and 60% duty cycle, the Ohmic heating Q may reach a level as high as 108 kW from a single gradient coil. Driving three gradient coils simultaneously (as in diffusion imaging) would triple the amount of heating. A relatively small coil size preferable for the head-only gradient coils exacerbates the heating problem due to reduction of the mass and the volume available for cooling tubes.

To mitigate the "shoulder clearance" problem, many previous approaches have relied on asymmetric head gradient designs. These designs are appealing because a) they may reduce the potential of PNS and CS since the shoulders and torso are disposed outside of the main gradient field; and b) a field linear volume is created at the end of the cylinder, and thus eliminates the "shoulder clearance" problem. However, the asymmetric head gradient also has several undesirable features, such as: in the asymmetric design, it is more difficult to balance the torque and to provide effective eddy current shielding, and, the linearity of the gradient field is much poorer than in conventional symmetric design. An additional shortcoming of the asymmetric design is, that due to the fact that Maxwell terms (concomitant terms) include odd orders, as well as even orders, their effect on the diffusion pulse sequence is undesirably complicated.

While some of these problems (such as the image distortions associated with gradient field nonlinearity might be manageable by applying reconstruction processing principles, in a diffusion MRI, b-factors associated with diffusion concomitant terms and their effect on fiber tracking might be less straightforward to quantify.

"Folded gradient" design is another approach to mitigate the "shoulder clearance" problem. In a conventional cylindrical transverse gradient coil design, the segments in the center of the coil (active segments) contribute to the desired magnetic field, while the segments on both ends of the coil (return paths) generate an undesirable field and contribute to the overall length of the coil.

To generate a magnetic field, an electrical current carrier must form a closed loop. In a gradient coil, half of the loop generates a desired magnetic field, while the other half (the return path) is necessary to complete the electrical loop, however, the return path generates an undesired field, and takes up space, thus increasing the length of the coil in a traditional design.

Shortening the length of the coil by folding the return paths toward the center of the coil produces a highly non-linear gradient, because the return paths and active segments are both moved toward the center of the coil, while the magnetic fields generated by them have opposite signs. It is quite a technical challenge to optimize the magnetic field in the target volume due to the physical constraints.

Notably, a conceptually similar, but more extreme approach had been developed in which the return paths were co-axial to the active segments along the radial direction, and thus did not contribute to the overall length of the coil.

A further optimization of a gradient field based on co-axial return paths called "sandwich" gradient coil design, has been used, where wire loops are embedded in circular planar disks. The active segments of each loop are placed close to the inner surface, while the return paths are placed close to the outer surface of the disk. The disks are then sandwiched together. Active segments surrounding the inner surface generate the desired field, while the return paths serve as a shielding.

Several desirable features arise from the "sandwich" design coil, such as shortening of the coil, elimination of the "shoulder clearance" problem, and reaching a highly uniform gradient field. However, the efficiency in this system is relatively lower than that in the conventional transverse gradient coil.

The gradient coils of magnetic resonance imaging are described in numerous publications and Patents. For example, U.S. Pat. No. 5,378,989 describes a magnetic field gradient apparatus for using a magnetic resonance imaging employing open magnets which allow access to a patient while the patient is being imaged. The magnetic field gradient apparatus employs two gradient coil assemblies and a gradient coil amplifier. Each gradient coil assembly has a gradient coil carrier with at least one gradient coil disposed on it. Each gradient coil carrier is comprised of a cylinder with a flange at one end. The gradient coil assemblies are positioned in the bore of each open magnet and spaced apart from each other allowing access to the patient, as shown in FIG. 2. This system overcomes the "shoulder clearance" problem by placing a patient between two gradient coil assemblies. However, this arrangement only applies to an "open magnet", which is used in the "open MRI" systems with clinical applications in low magnetic field strength (typically <0.5 Tesla), but has never been applied in the high field MRI (1.5 Tesla and above), because it is extremely challenging to generate uniform high magnetic field with the open magnet. The gradient coil design presented in '989 Patent does not apply to the modern high field magnet systems which use a cylindrical design with a patient positioned inside the magnet.

Another gradient coil arrangement, described in the Patent Application Publication No. 2012/0032679, is configured for generating a magnetic imaging field in an imaging region provided in a bore. The gradient coil assemblies include three separate actively shielded gradient windings for generating orthogonal gradient shields. This constitutes a total of six individual layers, three of which are the so-called primary windings (positive electrical current) and three of the shield windings (negative electric current). A space between the primary and shield windings allows for a sufficient gradient shield to be created inside the imaging gradient and also houses the cooling pipes.

As the return current path, and consequently, any generated magnetic field, is located outside of the bore, the return current path does not contribute substantially in the gradient path, thereby resulting in significant improvement in the linearity of the transverse gradient fields. This in turn allows for a reduction in the length of the gradient coil assembly.

However, this system, using cooling pipes, is susceptible to shortcomings associated with indirect cooling and direct internal cooling, and this design is only suitable for whole body MM system.

With the modern high-power gradient amplifiers, ohmic heating is a serious concern in gradient coil technology. Conventional gradient coil thermal management can be classified into 3 categories: 1) natural convection on the external surface of the gradient coil assembly, ii) forced convection between the coolant inside a tube and an adjacent current-carrying element with insulation dielectric material in between (referred to herein as an "indirect external cooling"), and iii) forced convection with the coolant inside a current-carrying element (such as a copper tube) of the gradient coil assembly (called "direct internal cooling").

The natural convection suffers from extremely low heat transfer coefficient, leading to limited thermal management capacity.

In the "direct internal cooling", when a coolant flows inside a copper tubing, the heat generated inside the copper tubing due to Ohmic heating effects will be dissipated to temperature-controlled coolant. The amount of heat removal capability of the forced convection inside the copper tubing is determined by Newton's Cooling Law.

$$Q = hA\Delta T \quad \text{(Eq. 1)}$$

where Q is the cooling capacity, A is the total heat transfer area between the source of heat and the coolant, h is the convective heat transfer coefficient, and $\Delta T$ is the the temperature difference between the surface and the coolant. A higher convective heat transfer coefficient indicates a better heat removal capacity of the coolant (i.e., better thermal management capacity).

The nature of the coolant internal flow is determined by the Reynolds number. Based on Reynolds number, the flow can be either a laminar flow or a turbulent flow.

$$Re = \frac{\rho U d_i}{\mu} \quad \text{(Eq. 2)}$$

where $\rho$ is coolant density, U is the coolant velocity, $d_i$ is a hydraulic diameter (internal diameter of the tube), and $\mu$ is the viscosity of the coolant.

For the ohmic heating effect, heat generated inside the copper tube is uniformly distributed, thus the entire copper tube can be treated as a uniform heat flux boundary condition. Therefore, the following constant heat flux boundary condition correlations are applicable.

$$Nu_{lam} = 4.36 \quad \text{(Eq. 3)}$$

$$Nu_{turb} = \frac{(f/8)(Re - 1000)Pr}{1 + 12.7(f/8)^{0.5}(Pr^{2/3} - 1)} \quad \text{(Eq. 4)}$$

$$h = \frac{Nu \cdot k}{d_i} \quad \text{(Eq. 5)}$$

where, Nu is the Nusselt number (dimensionless), f is the friction factor between the coolant and boundaries, Pr is Prandtl number, which is material property of coolant, h is the convective heat transfer coefficient, k is the thermal conductivity of coolant, $d_i$ is an effective hydraulic diameter (internal diameter) of the copper tubing.

$$T_o = T_i + \frac{q_s'' \pi d_i L}{\dot{m} c_p} \quad \text{(Eq. 6)}$$

$$T_s = T_o + \frac{q_s''}{h} \quad \text{(Eq. 7)}$$

$$q_s'' = \frac{I^2 R_{elec}}{\pi d_o L} \quad \text{(Eq. 8)}$$

where, $T_o$ is the coolant outlet temperature, $T_i$ is coolant inlet temperature, $q_s''$ is the heat flux boundary condition caused by the joule heating, I is the current flowing through the copper tubing, $R_{elec}$ is the electrical resistance of solid copper wire. $d_O$ is the outer diameter of the copper tubing, L is tube total length, m is the mass flow rate, and $c_p$ is the heat capacity of the coolant.

The pressure drop of the coolant at various flow rate through copper tubing is also an important factor to be taken into consideration.

$$\Delta P = \frac{\frac{1}{2} f \rho U^2 \frac{L}{d_i}}{1000} * 0.145 \quad \text{(Eq. 9)}$$

$$\dot{m} = \frac{1}{4} \pi d_i^2 U \quad \text{(Eq. 10)}$$

where f is friction factor, L is the total length, $\rho$ is coolant density. The pressure is converted to the unit of pressure per square inches (PSI). $\dot{m}$ is the flow rate inside the copper tubing.

It follows from Eq. 1 that a better cooling performance can be achieved by two approaches: i) enhancing heat transfer coefficient h; and ii) maximizing heat transfer area A. For the indirect cooling, the bottle neck of the effective thermal management is the high thermal resistance of insulating materials with low thermal conductivity between the coolant and the copper tubing. The insulating materials used to stabilize electric current carrying materials (e.g. copper wires of gradient coils), for example epoxy, have a thermal conductivity less than 2.5 W/mK. In contrast, copper has a thermal conductivity of about 380 W/mK. It thus appears that a direct cooling inside copper tubing is a preferred approach by eliminating insulating materials between the coolant and the copper tubing. However, a high pressure drop $\Delta P$ associated with the internal cooling approaches must be taken into account as well.

For the direct internal cooling, increasing the heat transfer area A by increasing tubing diameter is preferred in terms of heat dissipation from the copper tubing. However, a compact configuration of cooling using small diameter tubing is preferred for enhancing current density, and thus, for achieving a high gradient coil efficiency (referred to as the gradient field strength per unit current).

As a trade-off, the pressure drop $\Delta P$ associated with the coolant flow rate and the copper tubing dimensions has to be evaluated (Eq. 9) to achieve the required cooling efficiency (Eq. 2-Eq. 8).

Analytical calculations were performed with a copper tubing with 1.6 mm and the outer diameter ($d_o$) of 3.2 mm, respectively. The overall length L of the tube was 15 m per quadrant. When the copper tubing carries 200 Amp current, massive ohmic heating is generated inside the copper tubing (Eq. 8) therefore, the high flow rate of the dielectric coolant (for example, Duratherm 450 Oil) is vital to achieve a desired thermal performance. The flow rate is a trade-off between the thermal performance and the pressure drop. Thus, the flow rate can be systematically adjusted to identify the optimal point for both acceptable thermal performance and pressure drop. The nature of the coolant flow transits from the laminar to the turbulent flow regime at ~0.2 gallon per minute (GPM), where the effective heat transfer coefficient is improved dramatically. As a result, the sharp enhancement in heat transfer coefficient of coolant, copper tube surface temperature at the outlet decreases dramatically at 0.2 GPM. The transition phase between the laminar and the turbulent flow regime provides moderate increment in the heat transfer coefficient from laminar flow. However, the pressure drop across the copper tube is proportional to a square of the coolant velocity. In such a case, it is extremely challenging to maintain low surface temperature using high flow rate while keeping the pressure drop in a reasonable range (less than 200 pounds per square inch (PSI)), because practically most materials (e.g. hoses and tubes) cannot withstand a high pressure.

None of the conventional Mill scanners has solved the "shoulder clearance" problem in a single magnet bore arrangement. In addition, none of the prior art gradient coils used in the Mill scanners has overcome the shortcomings of the traditional cooling systems based on coolant flowing in tubes for cooling the gradient coils.

It would be highly desirable to fundamentally solve these two technical problems of the conventional gradient coils to achieve a torque balance and strong uniform magnetic field at the brain location during imaging, while achieving high gradient efficiency. It would be also highly desirable to provide a new cooling method to eliminate limitations associated with the cooling approach using a copper tubing which is a somewhat sub-optimal solution for the gradient coil cooling.

SUMMARY OF THE INVENTION

It is therefore an object of the present invention to provide a gradient coil for patient brain imaging adapted specifically for brain Mill scanners through an ergonomic approach to overcome the problem of the limited shoulder clearance in conventional head-only gradient coils where a cylindrical coil carrier is modified with a slanted surface (at one end or both ends of the cylinder-shaped carrier) which are correlated to an anatomical disposition between the human shoulder and the neck.

It is another object of the present invention to provide a gradient coil for a MM scanner which is capable of generating a stronger and more homogeneous magnetic field positively contributing to resolution and sensibility of the scanning, and where a patient may be positioned with his head inside the gradient coil in alignment with the area where the magnetic field is the most homogeneous.

It is another object of the present invention to provide a gradient coil for Mill scanning adapted specifically for scanning of a human patient's head, where the electrical current return elements of the coils are placed at the slanted surfaces, while the active electrical elements are placed on the cylindrical surface, thus resulting in a shortened gradient coil. This is highly beneficial for operational parameters of the gradient coil such as high slew (the speed of the coil switching) without an unwanted induction of a physiological response, i.e., peripheral neurostimulation and electrical cardiac stimulation.

It is a further object of the present invention to provide a gradient coil for MRI scanners using an external direct cooling approach with an optimized number of cooling channels and coolant distribution having the coolant flowing inside the cooling channels in a direct contact with the electrical conductors of the coil for highly efficient cooling of the gradient coils.

In one aspect, the present invention is a gradient coil system with an improved cooling for Magnetic Resonance Imaging (MRI) scanners adapted for brain imaging. The subject gradient coil is configured with: (a) a cylindrically contoured portion defining an internal bore (along the longitudinal axis) having a predetermined internal diameter, and (b) a slanted portion extending circumferentially outwardly along at least one end of the cylindrically contoured portion at a predetermined angle relative to the longitudinal axis thereof. The slanted portion defines an entrance opening at the outermost edge thereof having an entrance diameter exceeding the internal diameter of the internal bore.

The gradient coil is formed with at least an X coil layer having electrical conductors configured in a first coil pattern, a Y coil layer having electrical conductors configured in a second coil pattern and disposed in a first disposition relative to the X coil layer, and a Z coil layer including electrical conductors configured in a third coil pattern and displaced orthogonally with respect to the X and Y coil layers.

The electrical conductors of each of the X, Y and Z coil layers include respective active electrical elements and current return elements forming a closed electrical circuit. The current return elements of each of the X, Y and Z coil layers form the slanted portion of the gradient coil, while the active electrical elements form the cylindrically shaped portion of the gradient coil. The gradient coil creates a uniform magnetic field region inside the internal bore of the cylindrically contoured portion.

A highly efficient external direct cooling sub-system is provided which is configured with a plurality of cooling channels disposed in a surrounding relationship with the electrical conductors and filled with a cooling medium circulating within the cooling channels in a direct contact with the electrical conductors of at least one of the X, Y and Z coil layers of the subject gradient coil. The subject external direct cooling approach in the present gradient coil eliminates thermal resistance between the coolant medium and the heated electrical conductors (copper wires), attains a low pressure drop, and therefore, requires low pump power for producing adequate coolant flow in the cooling channels.

The subject gradient coil further includes a gradient coil holder housing configured with a substantially cylindrically shaped portion having a cylindrically shaped wall extending between two longitudinally spaced apart opposite ends, and at least one conically shaped extension member having a first edge (smaller diameter) and a second edge (larger diameter) coinciding with the outermost edge of the slanted portion. The conically shaped extension member is secured, by the first edge, to at least one end of the cylindrically shaped wall of the cylindrically shaped portion. The slanted wall of the conically shaped extension member is angularly displaced at a predetermined angle outwardly from the cylindrically shaped wall of the cylindrically shaped portion.

The X, Y and Z coil layers are secured to and supported by the gradient coil holder housing in mutually orthogonal relationship one with respect to another. It is preferred that the first coil pattern (X coil layer) is substantially similar to the second coil pattern (Y coil layer), while the Z coil layer pattern is different. It may be shaped as a solenoid with the electric wire extending in surrounding relationship with the longitudinal axis.

The active electrical portions of the X, Y and Z coil layers are secured to the cylindrically shaped wall, and the current return elements of the X, Y and Z coil layers are secured to the slanted wall of the conically shaped extension member.

The cooling channels of the external direct cooling sub-system are embedded in the cylindrical wall and the slanted wall of the gradient coil holder housing and are arranged circumferentially about the longitudinal axis in spaced apart relationship one each with respect to the other.

The predetermined angle between the cylindrically shaped and slanted walls of the gradient coil holder housing is determined in correlation to an anatomical disposition between the shoulders and the head of a patient, and preferably ranges between approximately 90 degrees and 150 degrees. The predetermined angle may be approximately 115°.

The entrance opening of the conically shaped extension member allows passage for a patient's shoulders for positioning of the patient's head in the internal bore in substantial alignment with the uniform magnetic field region. The subject design thus solves the "shoulder clearance" problem associated with conventional brain MM scanners.

In one embodiment, the gradient coil holder housing may be a single member housing. In an alternative embodiment, the gradient coil holder housing may be formed as an assembly of at least a first, second and third holder housings, combined together in a gradient coil assembly.

In such assembly, each of the first, second and third holder housings carries a respective one of the X, Y and Z coil layers.

In the assembly embodiment, the first and second holder housings are formed with the cylindrically shaped wall and the slanted wall of the conically shaped extension member disposed at at least one end of the cylindrically shaped wall, while the third holder housing is formed as a cylinder.

In one embodiment, the first and second patterns of the X and Y coil layers may be formed in a butterfly configuration, each secured to a respective one of the first and second holder housings, respectively, with a 90 degrees displacement relative the longitudinal axis. The third pattern of the Z coil layer may be formed in a solenoid configuration secured to the third holder housing and extending at the cylindrically shaped wall in surrounding relationship with the longitudinal axis.

In the gradient coil system, the subject external direct cooling sub-system may operate in a one-phase cooling mode or in a two-phase cooling mode. In the one-phase cooling mode, the coolant medium maintains a single liquid phase, while in the two-phase mode, the coolant medium undergoes a phase change at the electrical conductor's temperature exceeding a boiling point of the coolant medium.

When assembled, the gradient coil assembly has the second holder housing disposed in a concentric surrounding relationship with respect to the third holder housing (which is the innermost holder housing) about the longitudinal axis. The first holder housing (which is the outermost holder housing) is disposed in a concentric surrounding relationship with respect to the second holder housing about the longitudinal axis. The cooling channels may be embedded in the cylindrically shaped and slanted walls of the outermost first holder housing, but alternatively may be provided at the external surfaces of the second and/or third holder housing as well.

The gradient coil assembly further may include an outer housing disposed in a surrounding relationship with the cooling channels of the external direct cooling sub-system.

A distribution header containing the coolant medium is arranged in fluid communication with the plurality of cooling channels which extend between the distribution's header inlet and outlet. External convection is used in the subject cooling system to cool the copper wire. The coolant (or the fluid) inside the cooling channels flows across the copper wire of the coil (i.e., over the outer surface of the copper wire). The channels for the coolant are fabricated in the holder housing. The cross-section area of the coolant flow is determined by the size and the number of cooling channels, which is not limited by the inner diameter of a copper tube (as in the conventional designs internal direct cooling). The coolant channels inlet and outlet are designed to minimize pressure drop of the coolant flow with consideration of an even distribution of the coolant to each cooling channel. The distribution header is a reservoir for the coolant fluid, which is connected to the coolant channels. The distribution header is used to ensure that all the cooling channels have similar flow rate and therefore provide uniform cooling for the copper wires. The distribution header is formed as a reservoir having a height ranging between 5 mm and 50 mm, and preferably, approximately 30 mm.

The first, second and third holder housings are formed from an electrical insulator selected from a group of materials including fiberglass composites, polymers with a glass transition temperature exceeding 100° C., and their combination.

The first, as well as the second and/or third holder housings may include a first plurality of first grooves and a second plurality of second grooves, respectively, on an external surface of the cylindrically shaped wall and the slanted wall of the conically shaped extension member. The cooling channels are formed in the first grooves and sealed with a sealant material, wherein a ratio of (the number of the cooling channels x width of each cooling channel) to a circumferential length of the cylindrical portion ranges between 30% and 80%.

BRIEF DESCRIPTION OF THE DRAWINGS

FIGS. 4A and 4B show the X and Z coil layers, respectively, with the slanted extension, and FIG. 4C shows the innermost coil layer without the slanted extension;

FIG. 6A shows the outermost X coil layer in a direct contact with the cooling channels, FIG. 6B shows the cooling channels extending between the distribution header inlet and outlet, and FIG. 6C illustrates schematically the gradient coil holder housing with the coil grooves and the cooling channels grooves formed in the surface of the holder housing;

DETAILED DESCRIPTION OF THE PREFERRED EMBODIMENTS

Referring to FIGS. 3A-3C, 4A-4C, 5, 6A-6C, and 7-11B, the subject system 10 and method provide a unique solution for two major limiting factors of the conventional coil gradient technologies for head MRI scanning, namely, the "shoulder clearance" problem and heat dissipation. The design of the present gradient coil 12 is supported by an ergonomic approach, i.e., widening the entrance into the bore of the gradient coil to allow the shoulder clearance, enhanced by placing the current return paths on slanted planes which extend in parallel to the outline of the shoulders of the human patient. This effectively eliminates the limiting factor from the return paths that contribute to the length of the coil, while maintaining torque balance, and moving the region of the homogeneous field closer to the entrance of the system.

Figure 1:
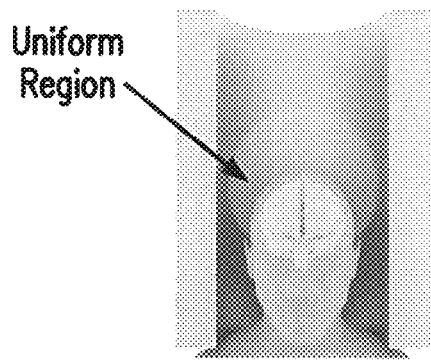
FIG. 1 depicts positioning of a patient's head inside of the conventional gradient coil of the head-only MRI scanning illustrating the "shoulder clearance" problem where the head is prevented from positioning at the uniform region of the created magnetic field.
Figure 2:
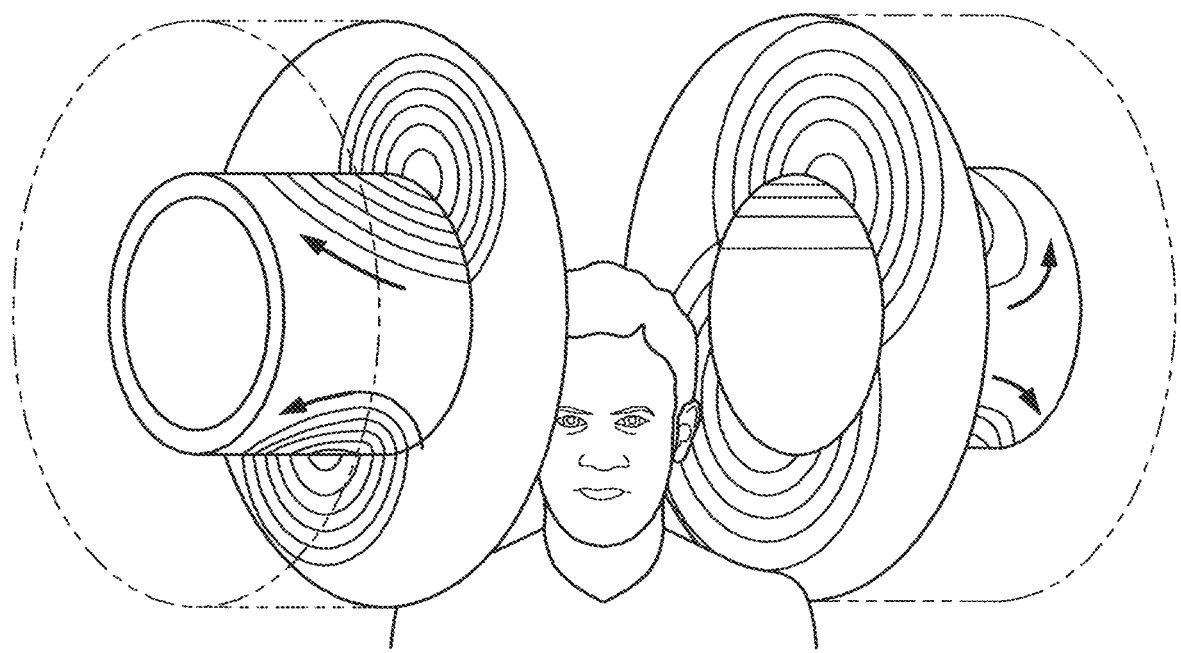
FIG. 2 is a prior art system for the MRI scanning with the patient's head positioned between two gradient coil assemblies.
Figure 3A:
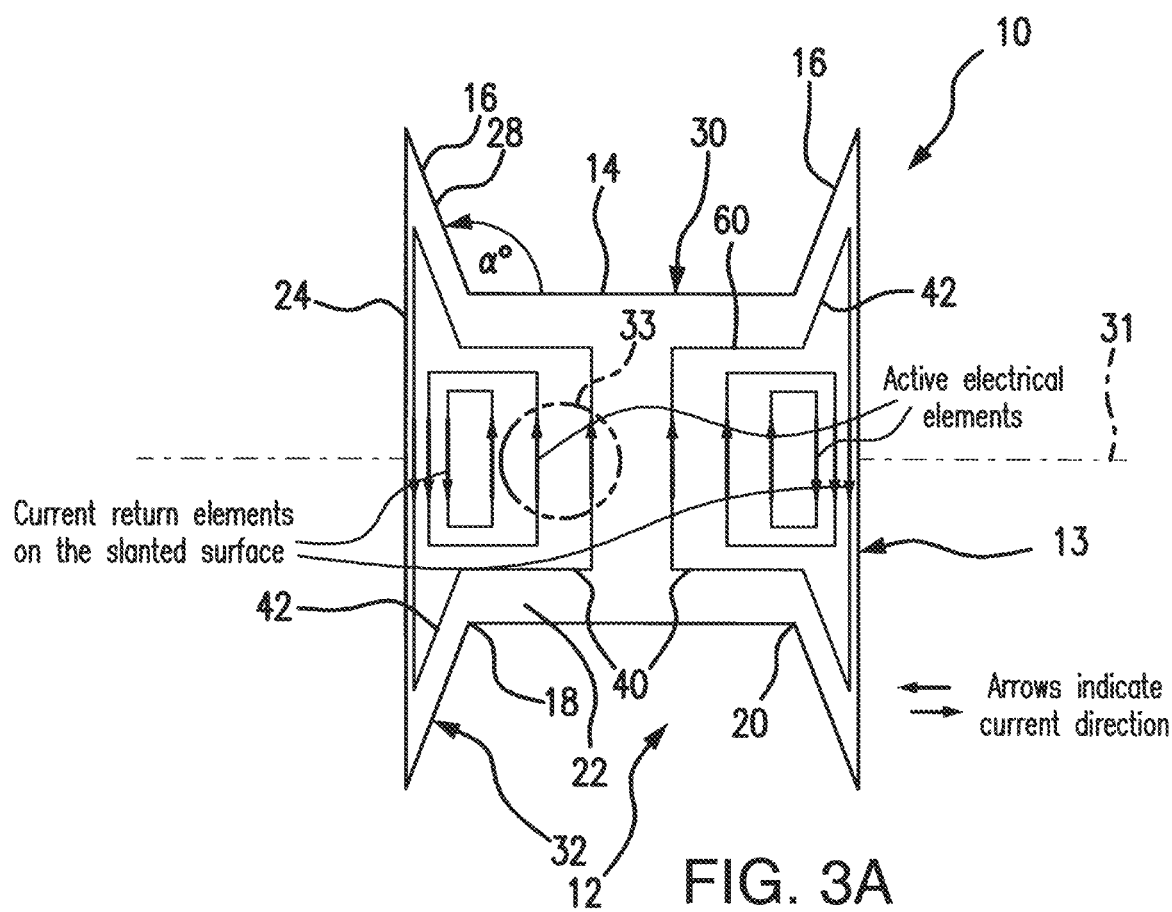
FIGS. 3A, 3B and 3C depict lateral views of the subject gradient coil design, where the gradient coil holder housing has a cylindrically shaped portion modified with a conically shaped extension member at both ends (FIG. 3A) and at a single end (FIG. 3B), and FIG. 3C depicting positioning of a patient inside the gradient coil bore.
Figure 3B:
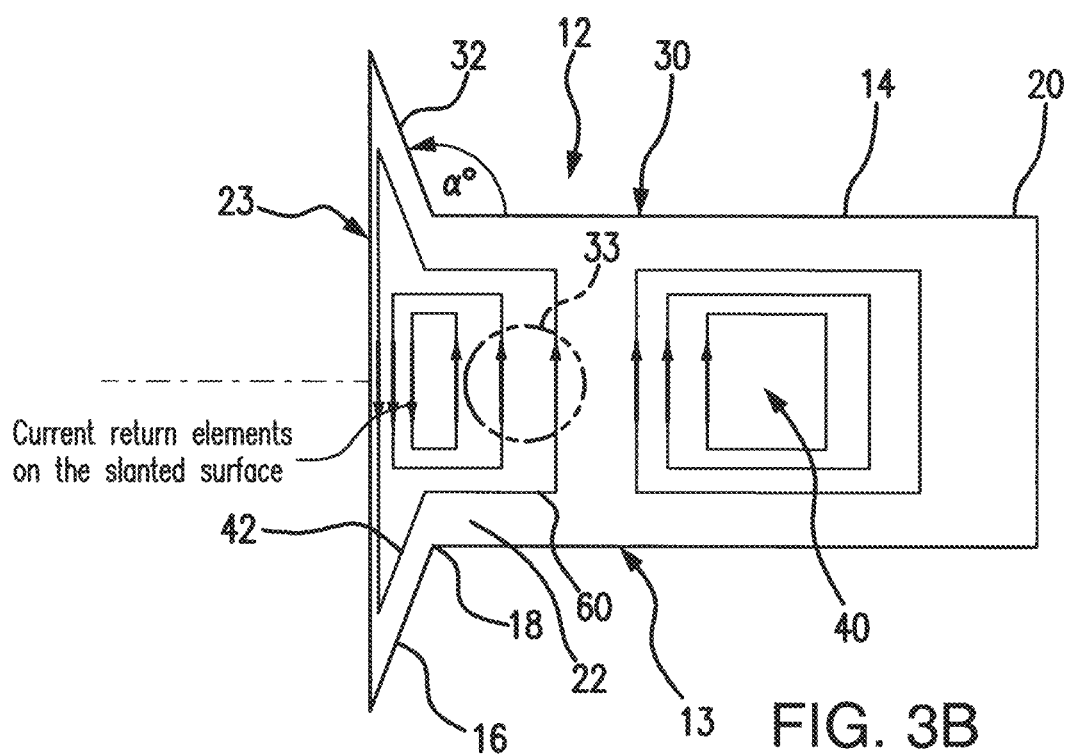

As shown in FIGS. 3A-3B and 4A-4C, the subject system 10 includes a gradient coil 12 secured in a predetermined fashion on a gradient coil holder housing 13 which is formed from an electro-insulating material (such as, for example, polymers with glass transition temperature larger than 100° C., fiberglass composites, and their combination). The holder housing 13 is formed with a cylindrically shaped portion 14 and a conically shaped extension member 16 which can be arranged either at one end 18 of the cylindrically shaped portion 14 (as shown in FIG. 3B) or at both ends 18, 20 of the cylindrically shaped portion 14 (as shown in FIG. 3A).

The conically shaped extension member 16 is formed with a slanted wall 32 extending a length 28 between an edge 22 (having a smaller diameter) coinciding with an internal diameter of a bore 23 defined in the cylindrically shaped body 14, and an outermost edge 24 having a larger diameter, for example, 90 cm.

Figure 3C:
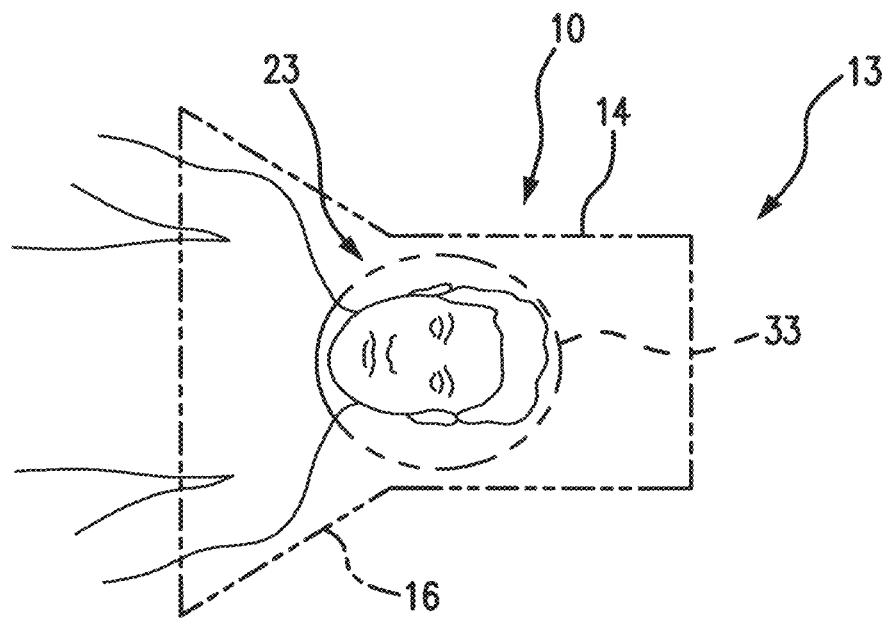

The slanted wall 32 of the conical extension member 16 is positioned in an angled disposition relative to the cylindrical wall 30 of the cylindrically shaped portion 14 (or to the longitudinal axis 31 of the holder housing 13), so that a substantial clearance is provided for the shoulders of a human patient to enter deeper into the bore 23 as shown in FIG. 3C. The subject gradient coil 12 comprises an X coil layer 34, Y coil layer 36, and a Z coil layer 38, each of which have a respective coil pattern, and are disposed orthogonally one to another.

Each of the X, Y, Z coil layers includes active electrical elements 40 producing a desired magnetic field, and current return elements 42 producing an undesirable magnetic field.

Compared with a traditional gradient coil design, the following distinct advantages appear from the subject approach:

a) Since the current return paths 42 do not occupy the space on the cylindrical wall 30, or inside the bore 23, the gradient coil 12 becomes shorter, and the homogeneous magnetic field region 33 moves closer to the end 18 or 20 of the cylindrical portion 14. This, in turn, contributes to a better reachability of the patient's head to the region 33 of the homogeneous field, as shown in FIG. 3C, thus minimizing (or solving) the neck-shoulder clearance problem, which leads to a better use of the homogenous region ("sweet spot") in the coil 12.

b) In addition, since the return paths 42 are displaced from the active electrical elements 40 of the closed electrical circuit, they generate less undesired magnetic field, leading to a stronger and more homogeneous effective gradient field strength.

c) Furthermore, with the coil 12 being short, and the return paths 42 being displaced from the active coil surface 30, the stray magnetic field generated by the current return paths 42 (that would normally induce peripheral nerve stimulation and cardiac stimulation) becomes weaker and extends a shorter distance, thus allowing a faster switching of the coil without the risk of exceeding FDA's dB/dt guideline for the nerve and cardiac stimulation.

The gradient coil holder housing 13 includes the slanted portion (wall) 16 at one or both ends 18, 20 of the cylindrical portion 14 which are configured to support a complicated pattern formed by the copper wire 60. A manufacturing process which would be capable of providing support for the complicated coil pattern is envisioned to use the 3D printing technology, or CNC machining. The X, Y, and Z coil layers 34, 36, 38 may be accompanied by additional X, Y and Z layers which may be used to reduce (shield) the magnetic field outside the coil. The X, Y and Z coil layers 34, 36, 38 are used to generate a magnetic field in X, Y and Z directions individually, which enables the gradient coil system 10 to create a magnetic field vector with any distribution.

Figures 4A, 4B, 4C:
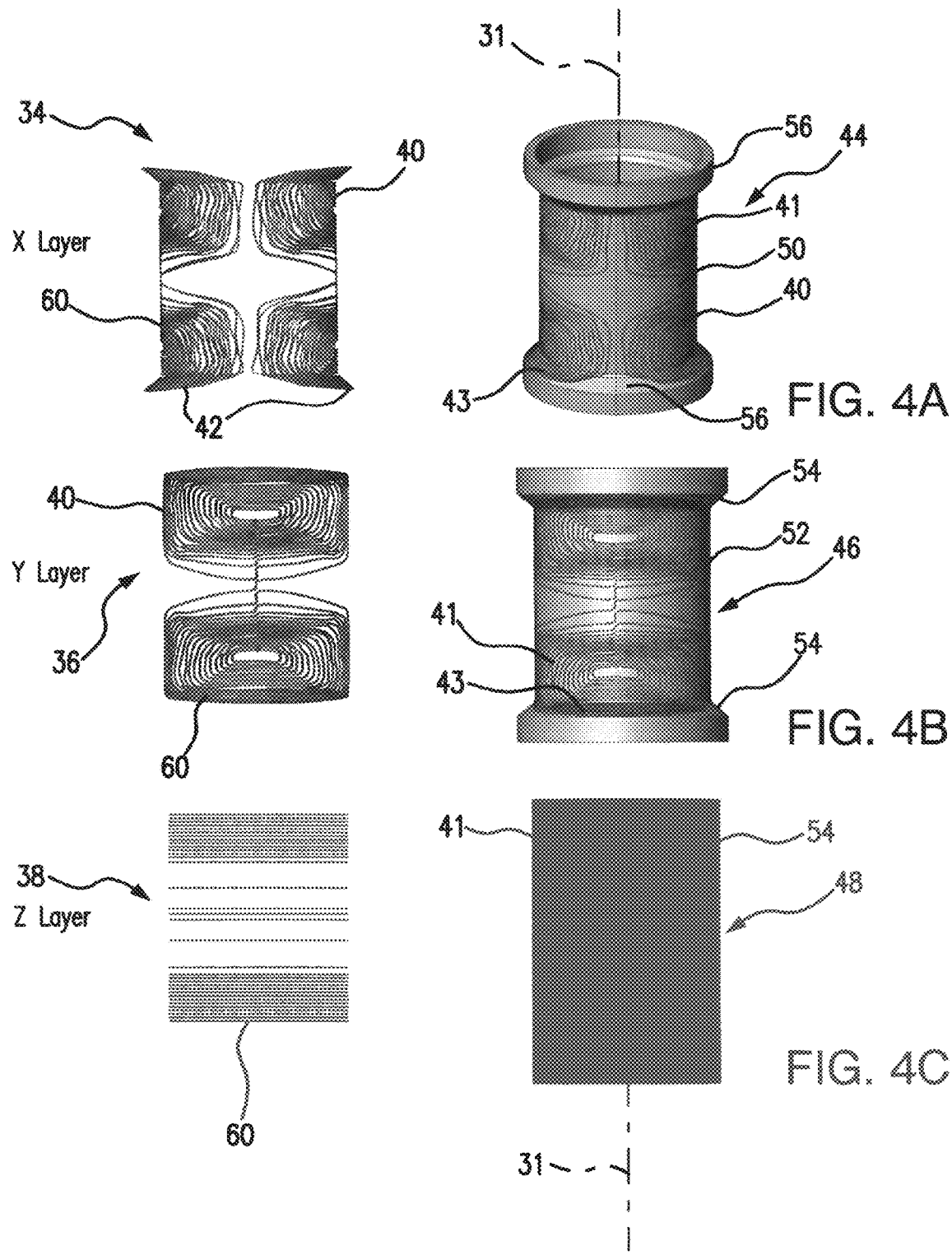
FIGS. 4A-4C show lateral views of the subject gradient coil layers, where
Figure 7:
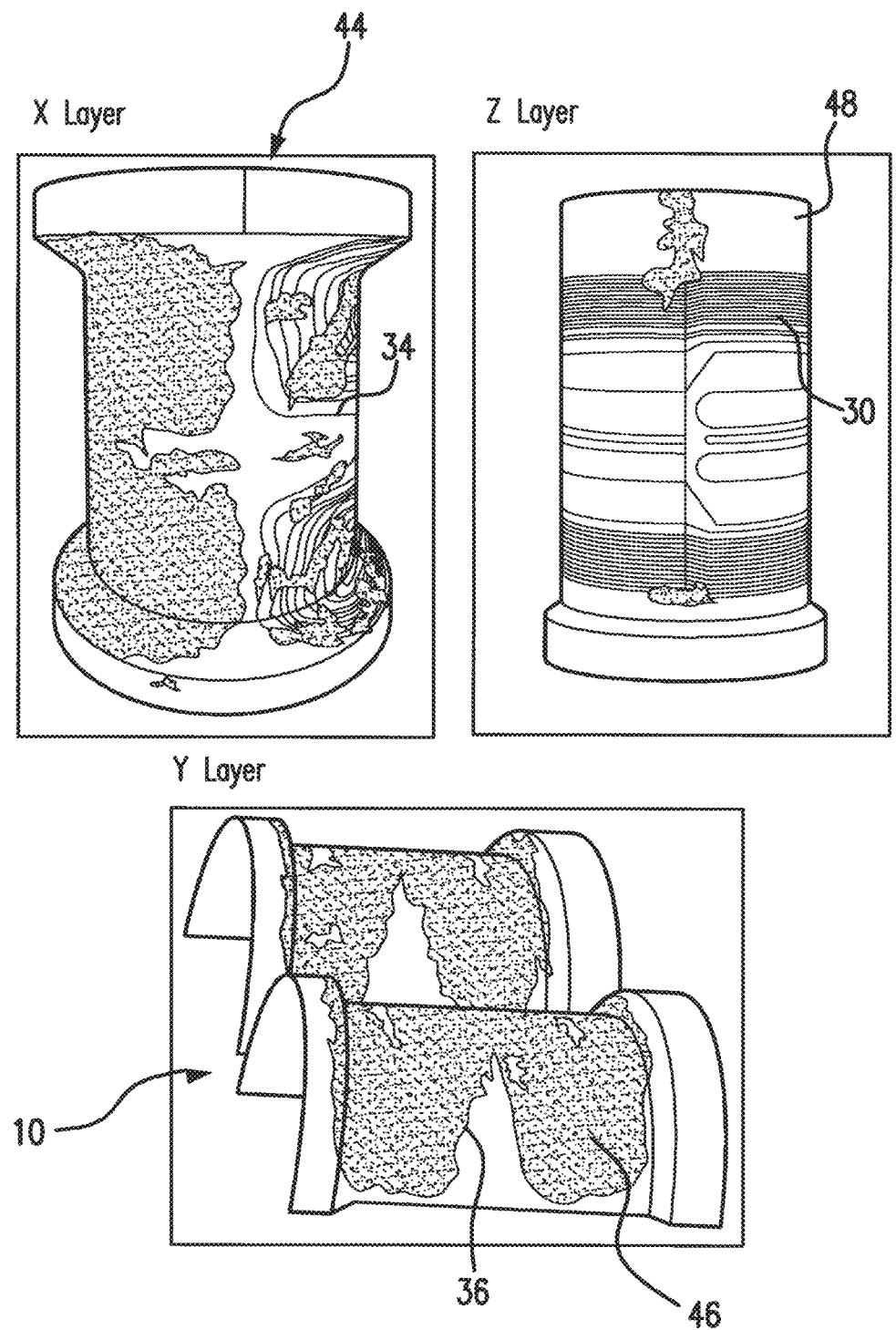
FIG. 7 depicts the X, Y and Z layers on the corresponding coil holders, each carrying a respective copper wire pattern of the subject gradient coil.

The gradient coil holder housing 13 may be fabricated as a single member housing supporting the X, Y and Z coil layers 34, 36, 38 thereon. Alternatively, the housing 13 may be assembled from individual holder housing portions, each carrying a respective one of the X, Y and Z coil layers. Referring to FIGS. 4A-4C and 7, the X, Y and Z coil layers 34, 36, and 38 are supported by respective coil holder housings. Specifically, as shown in FIGS. 4A and 7, the X coil layer 34 is supported by an X layer holder housing 44. Referring to FIGS. 4B and 7, the Y coil layer 36 is supported by the Y layer holder housing 36. Referring to FIGS. 4C and 7, the Z coil layer 38 is supported by the Z layer holder housing 48.

As shown in FIG. 4A, the X layer holder housing 44 has a cylindrical portion 50 and slanted walls 56 attached at both ends of the cylindrical portion 50. The Y layer holder housing 46 has a cylindrical portion 52 with the slanted walls 58 attached at both ends of the cylindrical portion 52. The Z layer holder housing 48 is shown in FIG. 4C, is formed with a cylindrical portion 54. In one embodiment, the Z layer holder housing 48 does not have a slanted walls at the ends thereof.

Figure 5:
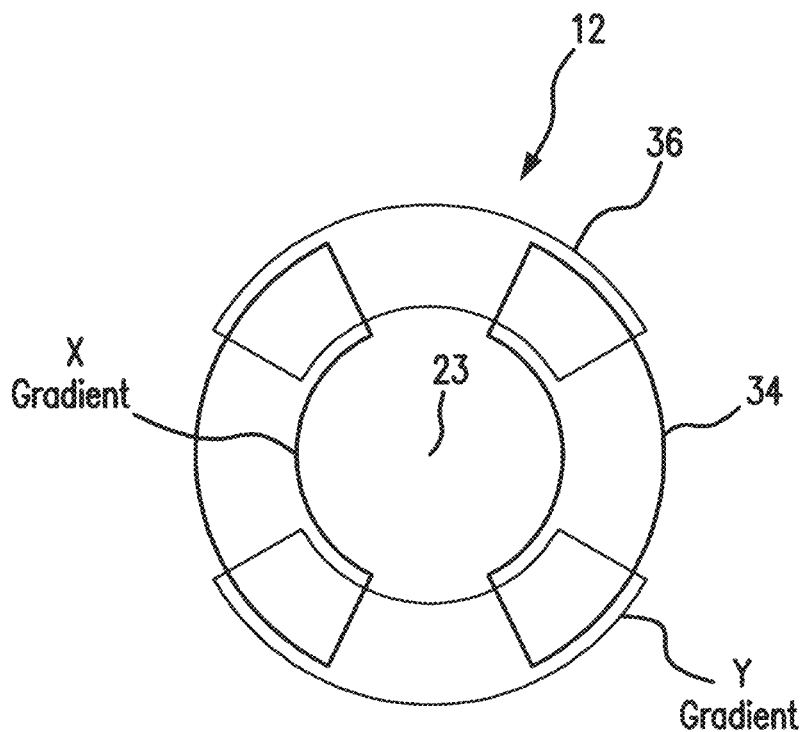
FIG. 5 shows the end view of the X and Y coil layers having similar patterns, but displaced around the longitudinal axis of the gradient coil holder housing by 90°.

As shown in FIGS. 4A and 4B, as well as FIG. 5, the X coil layer 34 and Y coil layer 36 may have similar wiring patterns axially displaced from one another by 90°. The pattern of the Z coil 38 may have a solenoid configuration with the electrical conductors 60 extending along the cylindrical walls 54 in surrounding relationship to the longitudinal axis 31. Specifically, as shown in FIGS. 4A-4C and 6C, the outer cylindrical surface 30 of the gradient coil holder housing 13, or the cylindrical portions 50, 52, and 54 of the X, Y and Z layer holder portions 44, 46 and 48, respectively, may be 3-D printed (or machined) to form grooves 41 therein configured in a complex pattern (for example, a "butterfly" pattern) to accommodate therein the copper wires 60 of the active electrical elements 40. The slanted surface 32 of the gradient coil holder housing 13, or the slanted surfaces 56 and 58 of the X and Y coil layer holder housing portions 44 and 46, respectively, are 3-D printed (or machined) to form therein grooves 43 configured in a complicated pattern to accommodate therein the current return elements 42. The grooves 41 and 43 may be 3-D printed or machined using CNC cutting, drilling, or formed using any other technology capable of forming complex patterns of the X, Y, and Z coil layers.

Figures 6A, 6B:
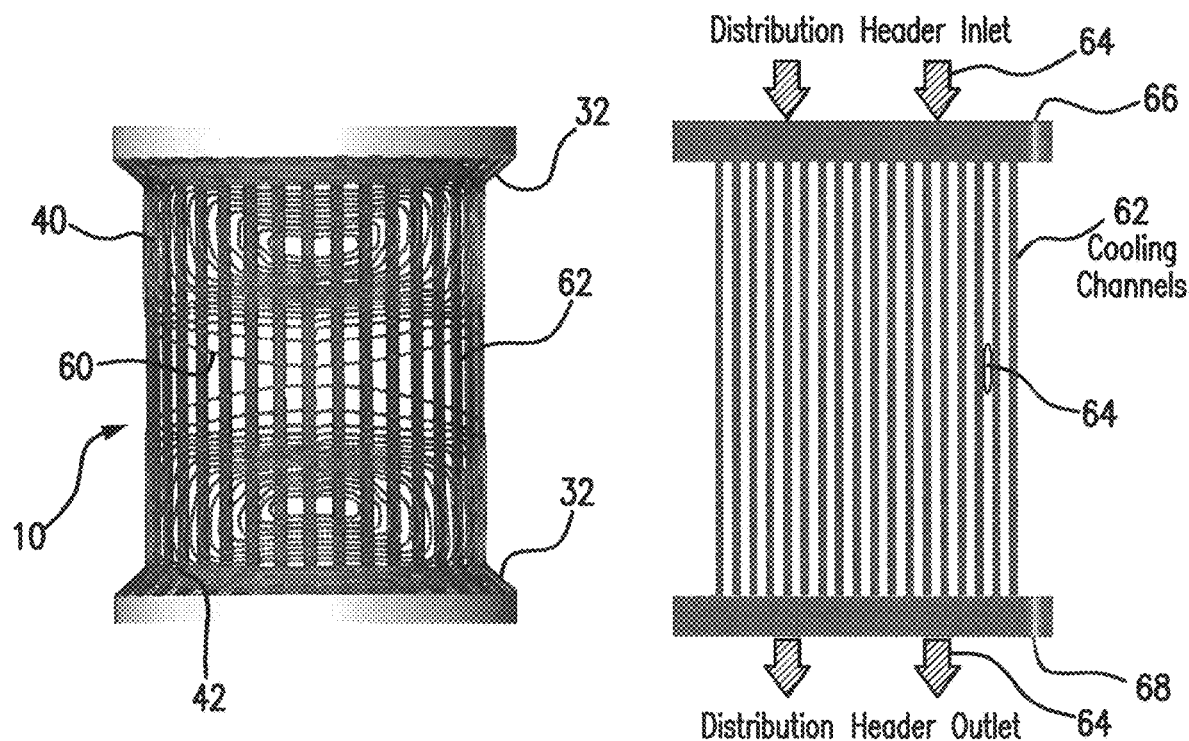
FIGS. 6A, 6B and 6C show a schematic representation of the subject external direct cooling sub-system used in the subject system where coolant flows inside the cooling channels with the gradient coil, where
Figure 6C:
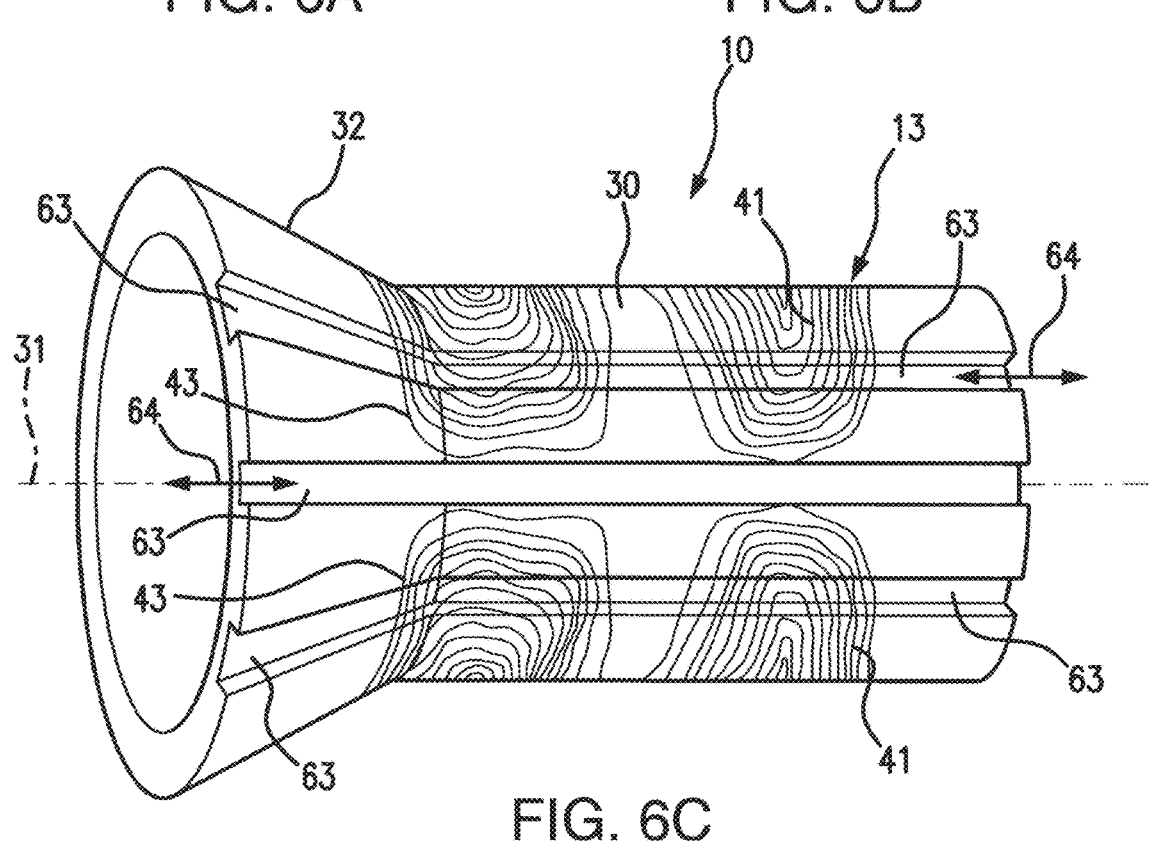

In addition, as shown in FIGS. 6A-6C, the slanted surface 32 and cylindrical surfaces 30 of the gradient coil holder housing 13 are 3-D printed (or machined) to form grooves 63 (disposed in contact with and intercrossing the grooves 41,43). In the implementation of the subject system, constituting the assembly 71 of the X, Y, and Z coil layer holder housing portions 44, 46, 48, the respective cylindrical and slanted surfaces of one, two or three thereof, may be configured with the grooves 63. In any implementation, the grooves 63 accommodate the cooling channels 62 of the external direct cooling sub-system used in the subject gradient coil 12. The external direct cooling approach benefits from a low thermal conduction resistance, and a large contact area between the heat source and a coolant. As shown in FIG. 6C, the grooves 63 may extend in parallel one to another and intersect with and are formed in a direct contact with the grooves 41, 43.

The size of the grooves 41 and 43 depend on the size of the copper wire 60 used for the gradient coil. The groove's depth can range from 1.5 to 3 times the diameter of the copper wire to be embedded therein. The groove's width can be 2 to 10 times the diameter of the copper wire 60. For example, a gauge 12 wire with a diameter of 2.05 mm may be used.

With regard to the grooves 63 for the cooling channels 62, they may have the width and depth similar to that of the grooves 41, 43, or different, depending on the design optimization requirements. Preferably, the ratio of (the number of cooling channels x the cooling channel width) to the perimeter of the cylinder surface 30 ranges between 30% and 80%.

Figure 8:
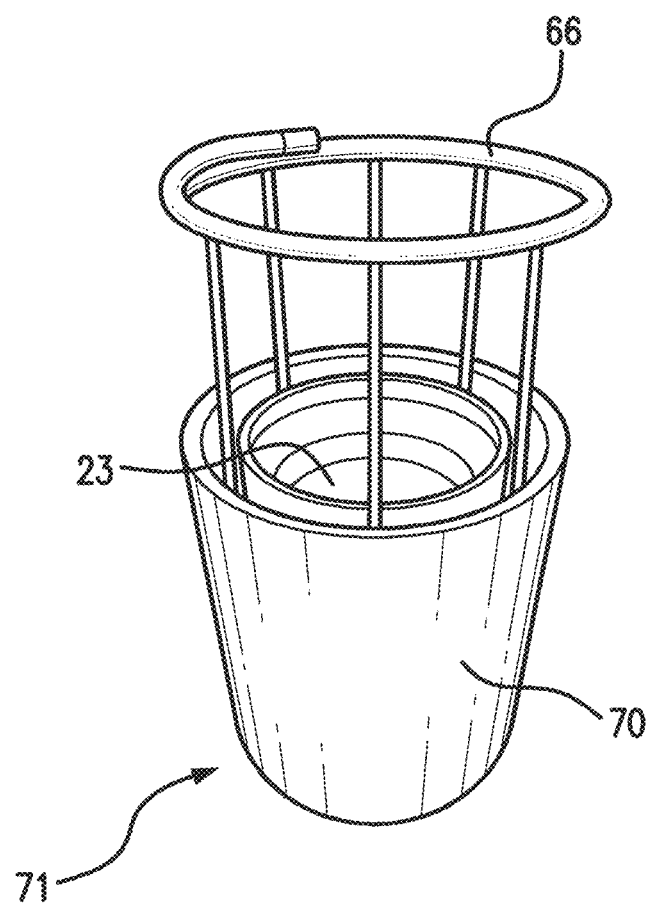
FIG. 8 depicts the subject gradient coil assembly with the outer magnetic field wire housing.

As shown in FIG. 8, an outer fiberglass housing 70 is provided which functions as a potting shell for the X, Y and Z coil layers holder housing assembly 71. Thus, in total, the gradient coil assembly has four holder housing portions 44, 46, 48 coaxially assembled one respective another with three circumferentially extending spacings therebetween.

Figure 9:
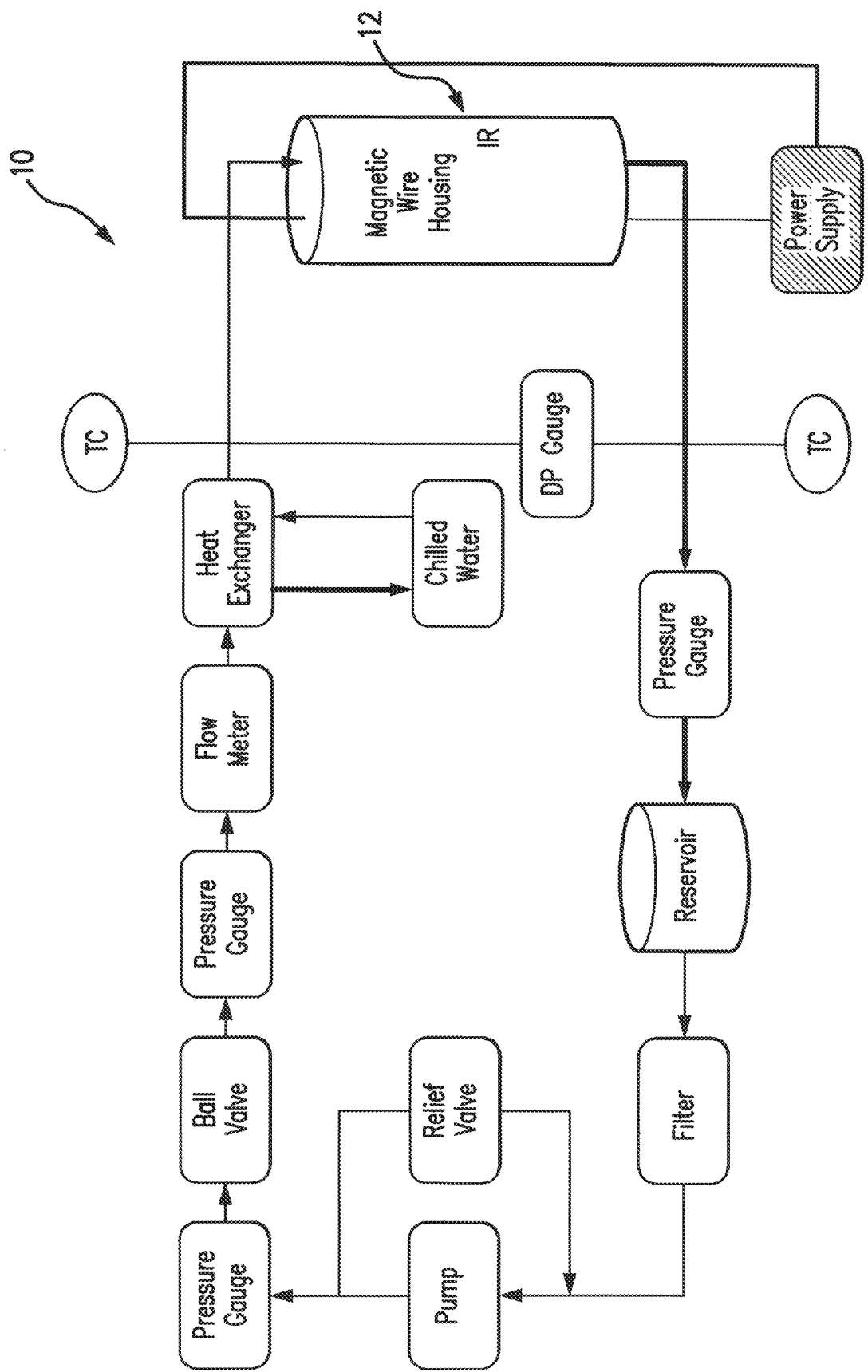
FIG. 9 is a schematic representation of the subject gradient coil assembly with the cooling loop.
Figure 10:
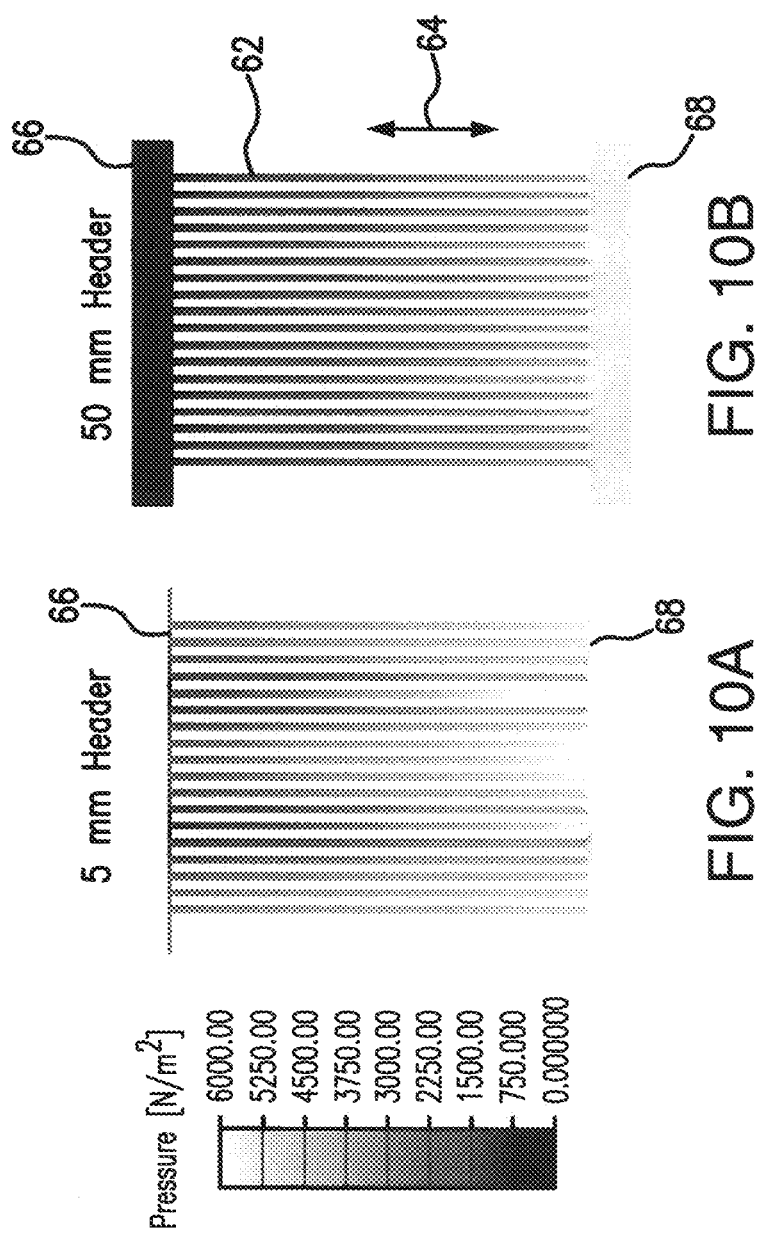
FIGS. 10A-10B are representative of the pressure distribution contour of the cooling channel with different header thickness (FIG. 10A showing a 5 mm thick header, and FIG. 10B showing a 50 mm thick header)
Figure 11:
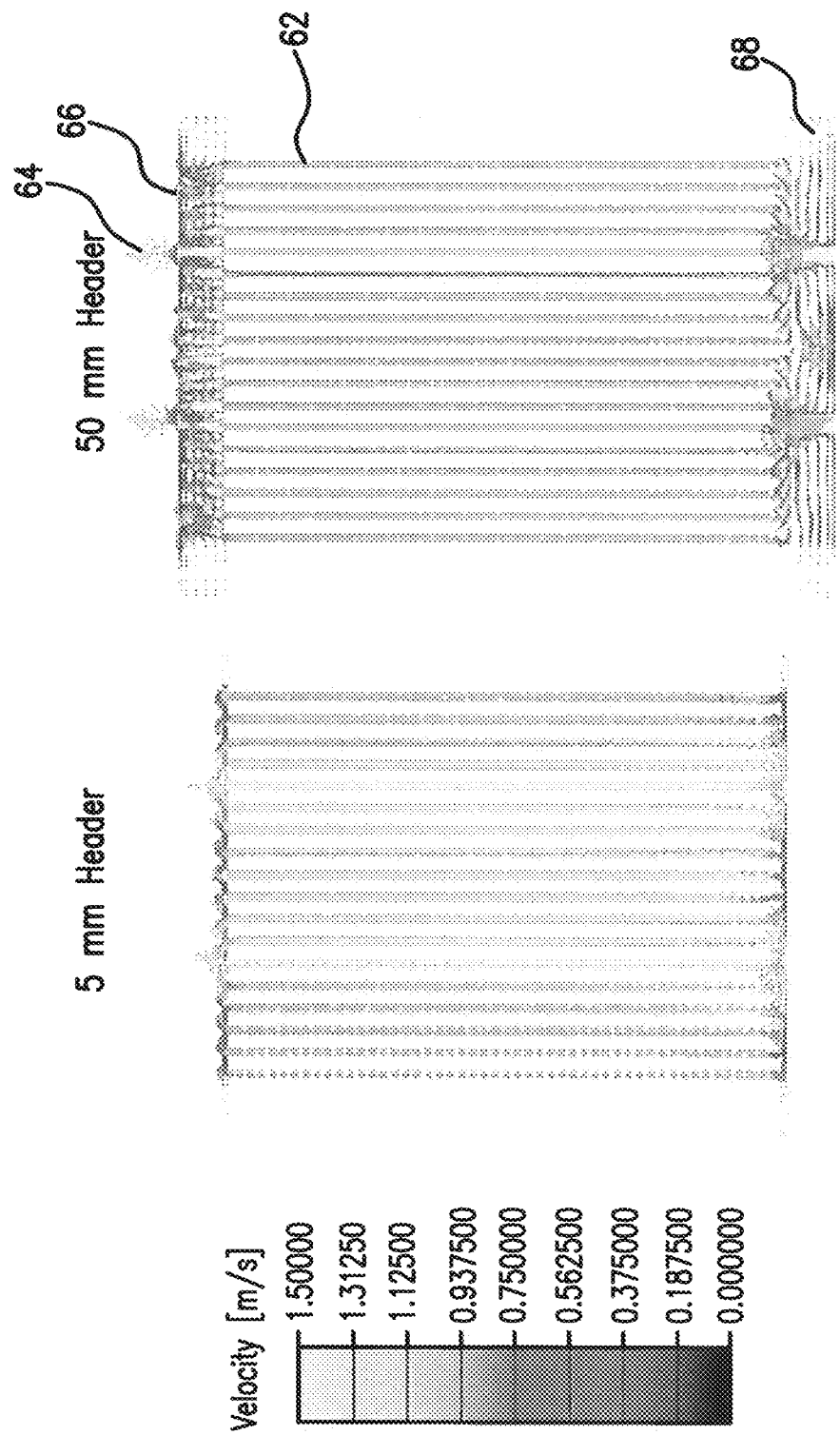
FIGS. 11A-11B are representative of the velocity vector of the cooling channel with different header thickness (FIG. 11A showing a 5 mm thick header, and FIG. 11B showing a 50 mm thick header)

Referring to FIG. 9, the gradient coil 12 operated in conjunction with a centrifugal gear pump, a pressure gauge, a relief valve, a flow meter, thermocouples, a differential pressure gauge, a debris filter, a heat exchanger, chilled water, a power supply and coolant (oil) reservoir. In experimental measurements, at constant voltage settings, the current reading of the power supply experienced a slight drop. In order to prevent over-pressurizing the entire magnetic field wire housing assembly 10, the pressure relief valve at the exit of the pump outlet was set to 20 PSI. Once the pump outlet pressure exceeds the pressure relief valve threshold, it automatically bypasses the coolant from the assembly. Thermocouples were embedded inside the gradient coil. The temperature inside the gradient coil can be used to control the flow rate of the coolant, and control the electric current. Once the inside temperature is above a critical value, the electric current was turned off. With the direct cooling approach, maximum temperature in X and Y layer is well controlled.

In experiments, the magnetic field distribution data was mapped with a VGM magnetic field strength sensor. The magnetic field gradient for the X coil layer was approximately 1.3 Gauss/cm when the electric current was 40 A. When the electric current increased to 600 A, (where the joule heating can be cooled effectively with the direct cooling method), the magnetic field gradient can be as high as 20 Gauss/cm. In comparison, the magnetic field gradient in the traditional systems is about 5 Gauss/cm.

The subject gradient coil employs a novel approach to arrange the electrical wires in a fashion that generates a uniform strong gradient field, and a novel thermal management method to remove the joule heating. The novel approach can i) substantially shorten the length of the coil; ii) better fit human body (heat+shoulder) with the designed slanted surface, iii) substantially enhance the gradient field strength; iv) efficiently cool the coil to avoid overheating caused by high electrical current, and v) attain a fast drive of the coil without exceeding FDA dB/dt limit.

A non-linear optimization method was applied to design a three-axis torque-balanced gradient coil for human brain imaging. In the exemplary design, the inner-most layer was the Z coil layer 38 having a conventional cylindrical shape (as shown in FIG. 4C), followed by X and Y coil layer 38, which have the cylindrical shape in the middle and the slanted surfaces at both ends.

The length of the Z cylinder was 28 cm, which is the effective length of the coil. The inner diameter of the Z cylinder was 30 cm. The outer most diameter of the slanted surface may be 46.5 cm up to 90 cm. This diameter was chosen to ensure enough clearance so that the coil could be placed over the patient shoulders of the commercial MRI scanners, and could be conveniently moved into/out of the magnet without the need for additional mounting structure. The angle between the cylindrical surface and the slanted surface correlates to the anatomical disposition between the shoulders line and the neck line of a grown up human patient, and may range between 90 and 150°, and preferably 115°.

The Z coil layer 38 may have a total of 38 loops of wires 60 configured in a toroid shaped extending at the surface of the Z coil layer holder 48 about the longitudinal axis 31. The X and Y wire layer 36, 38 may have 18 and 13 loops of wires in each quadrant of their "butterfly" pattern, respectively. A fraction of the current return paths in X/Y coils may rest on the cylindrical surface 30, but most of the remaining return paths 42 are embedded on the slanted surfaces 32 (as shown in FIGS. 3A-3B).

Each loop may be divided into 128 wire segments. For the X/Y coil layers 34, 36, each wire segment has 3 variables (x, y and z) to be optimized, while for the Z coil layer, only the z coordinates need to be optimized.

A sphere with a diameter of 21 cm at the center of the gradient coil is defined as the region of interest (ROI) to be optimized. Due to the intrinsic symmetry of the field distribution, 90 points in one octant of the sphere are defined as the discrete ROI for X/Y optimization, while 45 points in one rectangular plane (x=0,y>0) are defined for the Z coil layer.

A desired magnetic field at each point is defined. The magnetic field at each point of the ROI (Bm) is calculated, and the error function defined. The goal is to optimize the coordinates of these wire segments so that the error function is minimal under the physical constraints. The optimization code used was written in standard C language on a personal computer running Linux. The optimization process has been performed iteratively.

Given the unique shape of coil windings and cooling design for X/Y gradients, it is a challenge to build a porotype with conventional machining technologies. The additive 3D printing techniques were applied to build major frames for X and Y gradients with a required shape, winding patterns and cooling channels. Each of the X and Y coil layer was divided into 4 quadrants/modules. Each module is printed individually prior final assembly.

The Z coil layer is constructed with G10 fiberglass using 4 axis CNC machine due to its relative simple and straightforward shape.

Solid copper wires (for example, Gauge 12) are embedded into the grooves formed on the surfaces of the individual X, Y and Z coil layer holder housings 44, 46, 48. The X, Y, and Z holder housings 44, 46, 48 shown in FIG. 7 are potted together into the assembly 71, shown in FIG. 8, which subsequently is inserted in the external housing 70 made from a material having a high thermal conductivity and high dielectric epoxy.

Once the current-carrying pattern for the X, Y and Z coil layers are finalized using target field approach, a numerical simulation on magnetic field distribution is performed using ANSYS Electronic Desktop Maxwell V18.1 finite element software. The current-carrying element is set to AWG 12/10 copper alloy to mimic the actual application condition. The excitations, i.e. current input values to copper wires, is varied to evaluate the overall magnetic field distribution and strength information. Due to the current-carrying element geometry complexity, one continuous current-carrying element path was simplified (in experiments) to discrete patterns for a closed loop magnetic field simulation.

From the magnetic field distribution it was observed (in experiments) that a symmetric "butterfly" shape with sufficient homogeneity symmetric distribution had been achieved. With carefully calculated excitation input, the overall magnetic field strength can be modified to satisfy each application requirement. The middle non-magnetic field region offers magnetic field shielding effect. The highest magnetic field strength occurs near the current-carrying element, which agrees well with the Biot-Savart Law. The detailed mathematic explanation can be found in Eq. (11). With such magnetic field design for X, Y and Z layer, within the magnetic field domain, each coordinate corresponds to a unique magnetic field vector, which offers ultimate versatility for exploration of the magnetic field.

$$B(r) = \frac{\mu_0}{4\pi} \int_C \frac{I \cdot d\vec{l} \times \vec{r}}{|\vec{r}|^2} \quad \text{(Eq. 11)}$$

Since the subject gradient coil 12 does not have a conventional cylindrical or planar structure, the non-linear optimization approach, such as the momentum-weighted conjugate gradient decent (CGD) method, is particularly suitable for designing the winding patterns. The error function is defined as:

$$E = \sum_{m=1}^{M} (\bar{B}_m - B_m)^2 \quad \text{(Eq. 12)}$$

where $\bar{B}_m$ (with the line on the top) is the desired magnetic field at the $m^{th}$ point in the region of interest (ROI), or the target field), $B_m$ is the calculated magnetic field at the same point based on the Biot-Savart's law, and M is the total number of points prescribed in the ROI. It is apparent that E is a function of the coordinates of the wire elements. The goal is to find the optimum coordinates for each of the wire elements, $p_0, p_1, p_2, \ldots, p_N$, such that the error function E is minimal.

The following experimental constraints were applied to ensure that the design be practical for construction: (i) current must be continuous; (ii) the space between neighboring wires should be greater than defined minimum values, (iii) the wire elements should be within defined physical dimensions of the coil; and (iv) there must be no crossover between wires. These constraints can be readily satisfied when the variable to be optimized is one-dimensional.

For example, for a Z gradient coil on a cylindrical surface, the variables to be optimized are the z coordinates of the wire loops of constant diameters (in cylindrical coordinates (r, φ, z)). For the X and Y gradients, shown in FIGS. 4A-4B, (r, φ, z) need to be optimized. Specifically, $$\begin{bmatrix} r_{0,i+1} & \varphi_{0,i+1} & z_{0,i+1} \\ r_{1,i+1} & \varphi_{1,i+1} & z_{1,i+1} \\ \ldots \\ r_{N,i+1} & \varphi_{N,i+1} & z_{N,i+1} \end{bmatrix} = \begin{bmatrix} r_{0,i} & \varphi_{0,i} & z_{0,i} \\ r_{1,i} & \varphi_{1,i} & z_{1,i} \\ \ldots \\ r_{N,i} & \varphi_{N,i} & z_{N,i} \end{bmatrix} + \quad \text{(Eq. 13)}$$
$$\alpha_i \cdot \begin{bmatrix} dr_{0,i} & d\varphi_{0,i} & dz_{0,i} \\ dr_{1,i} & d\varphi_{1,i} & dz_{1,i} \\ \ldots \\ dr_{N,i} & d\varphi_{N,i} & dz_{N,i} \end{bmatrix} \cdot \begin{bmatrix} \beta & 0 & 0 \\ 0 & \gamma & 0 \\ 0 & 0 & 1 \end{bmatrix}$$

where $dr_{m,i}, d\varphi_{m,i}, dz_{m,i}$ are the search directions of the mth wire segment, at the ith iteration, along the r, φ, and z, derived from CGD, $\alpha_i$ is the step size along z at the ith iteration, β and γ are defined according to the following 2 conditions:

(i) for Z gradient coil layer design, β=γ=0.

(ii) for X/Y gradient coil layer design, β and γ are the momentum weightings of the step sizes for the radial and azimuthal coordinates.

Due to the versatility of 3D printing technology, the slanted surface and the complicated coil pattern may be easily incorporated in the subject holder housing design for optimal magnetic field distribution. Based on the numerical simulation result, it is promising to generate a strong magnetic field with excellent linearity distribution and such system can be sufficiently cooled using the external direct cooling approach. Duratherm 450 Heat Transfer Oil may be selected as a coolant due to its outstanding properties, such as a large dielectric constant, a high heat capacity, a low viscosity etc.

Referring to FIG. 7, a grey region on the left side of the X coil layer is JB-Weld epoxy, which serves as a binder between the copper wire and the grooves embedding the copper wire. JB-Weld epoxy also prevents any possible Line X spray coating to block the cooling channels. Prior to the final epoxy potting process for the whole assembly, BJB epoxy was applied to all X, Y, Z coil layers as a double safe protection measure to prevent potting epoxy penetration into the cooling channels.

The AWG 10 copper wire formed in a solenoid contour in the Z coil layer was embedded in the fiberglass grooves. Due to the extraordinary temperature resistance and mechanical properties of G10 fiberglass, there is no need for cooling. However, a 3D printed slanted surface may be attached to one side of the Z coil layer to ensure that the central point of all three layers overlaps.

The subject external direct cooling approach, shown in FIGS. 6A-6C, benefits from a low thermal conduction resistance, a large contact area between a heat source and a coolant. However, it also poses challenges for the coolant leakage-free construction during the assembly process.

In order to prevent leakage of the coolant from the cooling channels to the outside assembly, multiple generations of sealing trials have been performed and tested until the results were satisfactory. The trials included rolling numerous layers of epoxy or wrapping several layers of fiberglass sheet on the outer surface of the magnetic field wire housing and potting epoxy at both sides of the magnetic field wire housing assembly.

FIG. 8 shows the assembly 71 after the 3D printing, copper wire snapping, Line X coating, overall layers assembling, and epoxy potting processes. A large copper tube 66 above and below (not shown) the assembly 71 operates as an external flow distribution header. It collects the coolant from the pump. Based on the magnetic field layer operation conditions, the coolant 64 can be easily directed into the operational layer (cooling channels 62 shown in FIGS. 6A-6C) for cooling purposes with the assist of a ball valve.

Multiple thermocouples may be inserted at different locations between the layers prior to potting process to monitor the temperature inside the assembly for precautionary purposes. After application of ~10 gallon of potting epoxy, the X, Y and Z coil layers are bonded internally with very strong mechanical properties due to the high strength of potting epoxy, augmented with attachment of the G10 fiberglass tube 70 as an outer shell. At the same time, the low viscosity potting epoxy covers the entire housing surfaces, which provides great protection against the coolant leakage. Upon the entire assembly being sealed, it is connected to the cooling sub-system.

In FIG. 9, the debris filter is used as protection to trap any possible small particles prior to entering the gear pump. The relief valves bypasses the coolant from the system once the overall pressure is above a set threshold for safety reasons.

The pressure drop across the magnetic field wire housing assembly 71 is measured with differential pressure gauge and one absolute pressure gauge. The pressure difference and temperature readings are obtained from the pressure gauge, the differential pressure gauge and the thermocouples before and after the coolant exchanged heat with the copper wires inside magnetic field wire housing.

To resolve the problem associated with internal-wall direct cooling, the subject "outer-wall direct cooling" has been incorporated into the subject gradient coil 12. Instead of using the traditional approach, i.e., the copper tubes, as the electrical conductor and pumping coolant inside the copper tube to dissipate the heat generated by the copper tubing, the subject system 10 uses solid electrical conductors (e.g., copper wires 60 for the gradient coil), and the cooling channels 62 disposed in a direct contact with the electrical conductors, as shown in FIGS. 6A-6C.

Solid copper wires 60 are beneficial in reducing the overall electrical resistance by increasing cross section area of a conductor for the gradient coil 12. The cooling channels 62 extend in the 3-D printed (or machined) grooves 63 formed on the cylindrical surface 30 and the slanted surfaces 32 of the gradient coil holder housing 13. The cooling channels 62, in one implementation, may be provided on the outermost coil layer housing of the gradient coil assembly 71, for example, on the X layer holder housing 44. Alternatively, the cooling channels 62 may be formed on all three of the coil layer housings 44, 46, 48, or on any two of them. As an example, but not to limit the scope of the subject invention to this particular implementation, the subject external direct cooling sub-system is described as formed on the X coil layer housing 44. Since the coolant 64 is in a direct contact with the outer wall (for example, the X coil layer housing 44) of the electrical conductors 60 forming the coil, it eliminates thermal resistance which is present between the coolant and a copper tubing in the traditional systems. Importantly, the heat transfer area is determined by the size and the number of the cooling channels 62, which is no longer limited by the inner diameter of a copper tube (as in the traditional direct internal cooling).

The coolant channels' inlet and outlet, also referred to herein as a distribution header inlet 66 and a distribution header outlet 68, shown in FIGS. 8, 10A-10B and 11A-11B, are designed to minimize the pressure drop of the coolant flow with consideration of an even distribution of the coolant to each cooling channel 62. This approach simultaneously achieves the: a) elimination of the thermal resistance between the coolant and the heated copper wires of the gradient coil; b) controllable large contact area for the heat transfer; c) an extreme low pressure drop; and d) a compact current carrying element configuration for high gradient field strength.

With a high electrical current passing through the coil, a large amount of heat is generated within the X, Y, Z coil layers. The subject technique is developed to efficiently cool the coil, allowing high current density in a small gradient coil, and to substantially increase the magnetic field strength. The subject design achieves 2.5 to 3 times stronger gradient field strength than that is available in modern MRI scanners.

In the direct cooling approach, there are no interface layers between the copper wire and the heat transfer fluids, thus the associated temperature drop is avoided.

As seen in FIGS. 6A-6C, in the subject External Direct Cooling, the heat transfer fluid, or the coolant 64, flows over and in contact with the solid copper wire. To provide the uniform cooling performance for the copper wire 60, the number of the cooling channels 62 and the coolant distribution has been optimized in the subject system. A uniform coolant distribution among all the cooling channels 62 is important to the homogeneous cooling performance. For a mal-distributed coolant, the cooling channels without sufficient coolant flow rate may not be able to remedy overheating, which may compromise the performance of entire gradient coil system.

One practical way to ensure evenly coolant distribution is to increase the pressure difference ratio between the cooling channel 62 and the distribution header 66, 68. If the pressure drop in the distribution header is negligible compared to that in cooling channels, the flow will experience no impedance in the header, leading to a uniform distribution.

Both the single-phase cooling and the two-phase cooling may be applied to the subject direct cooling. In the single-phase cooling, the coolant maintains liquid phase. In the two-phase cooling, there is phase change from liquid to gas when the copper wire temperature exceeds the boiling point of the coolant.

The heat transfer fluid, or coolant, is a dielectric fluid in order to be able to flow in direct contact with the electrified components in the system.

As part of an optimization of the cooling channels number and the coolant distribution, it is important to ensure that, as the coolant enters each channel, there is a sufficient flow rate to maintain the maximum temperature below a safety threshold. In that case, the flow distribution from the header to each individual channel becomes very important. Without a proper design of the coolant distribution header, the coolant may rush into a cooling channel near the distribution header inlet and outlet. While for those cooling channels located far away from the distribution inlet and outlet, an insufficient flow will cause poor cooling performance, which leads to the risk of local overheating.

The distribution header design for the uniform coolant distribution has been optimized. The schematic of flow distribution modeling is shown in FIGS. 10A-10B. In order to compare the effect of different distribution header dimensions on the overall flow distribution, a simulation was performed in ANSYS ICEPAK module with the Duratherm 450 oil as the coolant. The volumetric flow rate, pressure drop and velocity distribution in each individual channel were compared and analyzed by parametrizing flow distribution header thickness.

FIGS. 10A-10B show the pressure contour of the coolant distribution with distribution headers 66, 68 having height of 5 mm and 50 mm. It was observed that the 50 mm header provides enough space for the flow to be well distributed prior to entering each channel. For the 50 mm header, not only overall pressure drop is lower compared to the thinner header, but also the pressure distribution of each channel is more uniform.

FIGS. 11A-11B are representative of the velocity vector plot of flow distribution in the cooling channels for different header's thicknesses. For the 5 mm header design, the inlet is close to certain cooling channels, which results in more coolant flows through those channels. The flow velocity in such channels is obviously higher than that in other channels. However, for 50 mm header case, before the coolant enters the cooling channel, the inlet flow is already well spread in the 50 mm thick header, it does not make a noticeable difference for cooling channel's location with respect to the distribution header inlet and outlet. This yields evenly distributed flow in the cooling channels.

From the velocity distribution for the cooling channels shown in FIGS. 11A-11B, it is concluded that with thicker channels, not only will the overall pressure drop be decreased, but also the flow is more evenly distributed, which ensures the cooling performance in each cooling channel. However, a too thick distribution header will consume more coolant, which is not economically efficient. Therefore, the thickness of the header must be optimized to find the appropriate minimum thickness for acceptable distribution of coolant.

Figure 12:
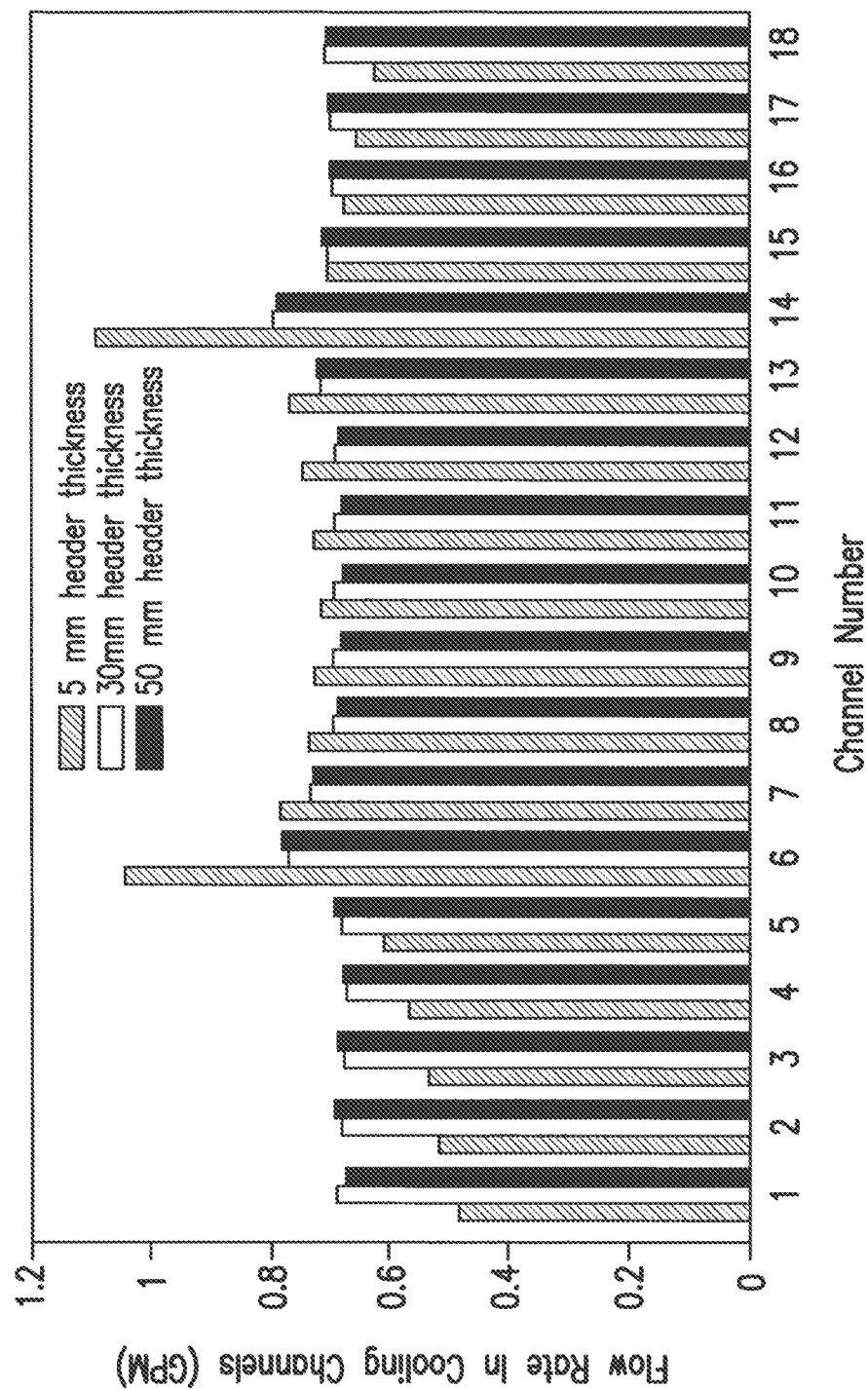
FIG. 12 is representative of a diagram of a flow rate in each cooling channel with different header thicknesses (5 mm, 30 mm, and 50 mm).

Shown in FIG. 12, the flow rate in each channels is listed for 3 cases with 5 mm, 30 mm and 50 mm header thickness. The 30 mm thick header is selected as an optimal header thickness for the acceptable pressure drop and flow rate distribution.

The magnetic field distribution and thermal management tests have been performed on full scale magnetic wire housing assembly. Thermocouples were used to monitor the temperature between layers X, Y and Z coil. The temperature readings demonstrated that the coolant experiences temperature rise after contact with the heated copper wire, which indicates effective heat transfer between the coolant and the copper wire. The increment of the temperature reading of the thermocouple placed between X and Y layer suggests there was some portion of thermal energy propagating from X layer to Y layer. Therefore, the overheating issue can be remedied by both convective cooling by circulating coolant and conduction dissipation through potting epoxy. The numerical simulation model was built to investigate the copper wire surface temperature and temperature distribution within the magnetic field wire housing assembly.

Although this invention has been described in connection with specific forms and embodiments thereof, it will be appreciated that various modifications other than those discussed above may be resorted to without departing from the spirit or scope of the invention as defined in the appended claims. For example, functionally equivalent elements may be substituted for those specifically shown and described, certain features may be used independently of other features, and in certain cases, particular locations of elements, steps, or processes may be reversed or interposed, all without departing from the spirit or scope of the invention as defined in the appended claims.

What is claimed is:

1. A gradient coil system with an improved cooling for Magnetic Resonance Imaging (MRI) scanners adapted for brain imaging, comprising:
    a gradient coil configured with a cylindrically contoured portion defining an internal bore along a longitudinal axis of said cylindrically contoured portion and having a predetermined internal diameter, and a slanted portion extending circumferentially outwardly along at least one end of said cylindrically contoured portion at a predetermined angle relative to said longitudinal axis thereof, said slanted portion defining an entrance opening at the outermost edge thereof having an entrance diameter exceeding said internal diameter of said internal bore, wherein said gradient coil is formed with at least an X coil layer having electrical conductors configured in a first coil pattern, a Y coil layer having electrical conductors configured in a second coil pattern and disposed in a first disposition relative to said X coil layer, and a Z coil layer including electrical conductors configured in a third coil pattern and displaced orthogonally with respect to said X and Y coil layers,
    wherein the electrical conductors of each of said at least X, Y and Z coil layers include respective active electrical elements and current return elements forming a closed electrical circuit, wherein said current return elements of each of said at least X, Y and Z coil layers form said slanted portion of said gradient coil, and wherein said active electrical elements form said cylindrically shaped portion of said gradient coil, wherein said gradient coil creates a uniform magnetic field region inside said internal bore of said cylindrically contoured portion.

2. The gradient coil system of claim 1, further including an external direct cooling sub-system configured with a plurality of cooling channels disposed in a surrounding relationship with said electrical conductors and filled with a cooling medium circulating within said cooling channels in direct contact with said electrical conductors of at least one of said X, Y and Z coil layers of said gradient coil.

3. The gradient coil system of claim 2, further including a gradient coil holder housing configured with a substantially cylindrically shaped portion having a cylindrically shaped wall extending between two longitudinally spaced apart opposite ends thereof, and at least one conically shaped extension member having a first edge and a second edge coinciding with said outermost edge of said slanted portion, and secured, by said first edge thereof, to at least one end of said cylindrically shaped wall of said cylindrically shaped portion, wherein said slanted wall of said at least one conically shaped extension member is angularly displaced at said predetermined angle outwardly from said cylindrically shaped wall of said cylindrically shaped portion;
wherein said X, Y and Z coil layers are secured to and supported by said gradient coil holder housing in mutually orthogonal relationship one with respect to another, and wherein said first coil pattern is substantially similar to said second coil pattern;
wherein said active electrical portions of said X, Y and Z coil layers are secured to said cylindrically shaped wall, and wherein said current return elements of said X, Y and Z coil layers are secured to said slanted wall of said conically shaped extension member; and
wherein said plurality of cooling channels are embedded in said cylindrical wall and said slanted wall of said gradient coil holder housing and are arranged circumferentially about said longitudinal axis in a spaced apart relationship each with respect to the other.

4. The gradient coil system of claim 3, wherein said predetermined angle between said cylindrically shaped and slanted walls of said gradient coil holder housing is adapted to be correlated to an anatomical disposition between the shoulders and the head of a human patient, said predetermined angle ranging between approximately 90 degrees and 150 degrees, and
wherein said entrance opening of said conically shaped extension member allows a passage for a patient's shoulders for positioning of the patient's head in said internal bore in substantial alignment with said uniform magnetic field region.

5. The gradient coil system of claim 3, wherein said predetermined angle is approximately 115°.

6. The gradient coil system of claim 3, wherein said gradient coil holder housing includes at least a first, a second and a third holder housings, assembled together in a gradient coil assembly, each of said first, second and third holder housings carrying a respective one of said X, Y and Z coil layers thereon, and
wherein each of said first and second holder housings is formed with said cylindrically shaped wall and said slanted wall of said conically shaped extension member disposed at at least one end of said cylindrically shaped wall.

7. The gradient coil system of claim 6, wherein said first and second patterns of said X and Y coil layers are formed in a butterfly configuration, each secured to a respective one of said first and second holder housings, respectively, with a 90 degrees displacement relative said longitudinal axis, and wherein said third pattern of said Z coil layer is formed in a toroidal configuration secured to said third holder housing extending at said cylindrically shaped wall thereof in a surrounding relationship with said longitudinal axis.

8. The gradient coil system of claim 2, wherein said external direct cooling sub-system operates in a one-phase cooling mode or in a two-phase cooling modes, wherein in the one-phase cooling mode, said coolant medium maintains a single liquid phase, and in said two-phase mode, said coolant medium undergoes a phase change at the electrical conductor's temperature exceeding a boiling point of said coolant medium.

9. The gradient coil system of claim 6, wherein said gradient coil assembly includes said second holder housing disposed in a concentric surrounding relationship respective said third holder housing about said longitudinal axis, wherein said first holder housing is disposed in a concentric surrounding relationship respective said second holder housing about said longitudinal axis, wherein said cooling channels are imbedded in the cylindrically shaped and slanted walls of said at least first holder housing, and wherein said gradient coil assembly further includes an outer housing disposed in a surrounding relationship with said cooling channels of said external direct cooling sub-system.

10. The gradient coil system of claim 3, further including a distribution header inlet and a distribution header outlet containing said coolant medium and arranged in a fluid communication with said plurality of cooling channels extending between said distribution header inlet and outlet, said distribution headed inlet and outlet operating to provide substantially uniform flow rate of said coolant medium in said plurality of said cooling channels, thus attaining a uniform cooling of the electrical conductors in said gradient coil, wherein each of said distribution header inlet and outlet is formed as a reservoir having a height ranging between 5 mm and 50 mm.

11. The gradient coil system of claim 10, wherein the height of said each distribution header inlet and a distribution header outlet is approximately 30 mm.

12. The gradient coil system of claim 6, wherein said third holder housing has a length of approximately 28 cm with said internal diameter of approximately 30 cm.

13. The gradient coil system of claim 12, wherein said outermost diameter of said slanted wall of said first holder housing is approximately 90 cm, and wherein the length of said first holder housing is approximately 39 cm.

14. The gradient coil system of claim 13, wherein the length of the slanted wall ranges between 9 cm and 14 cm.

15. The gradient coil system of claim 7, wherein said Z coil layer has approximately 38 loops of a copper wire, wherein said X coil layer has approximately 18 loops of copper wire in each half of said butterfly pattern thereof, and wherein said Y coil layer has approximately 13 loops of copper wire in each half of said butterfly pattern thereof.

16. The gradient coil system of claim 13, wherein said first, second and third holder housings are formed from an electrical insulator selected from a group of materials including fiberglass composites, polymers with a glass transition temperature exceeding 100° C., and combination thereof.

17. The gradient coil system of claim 6, wherein at least said first holder housing further includes a first plurality of first grooves and a second plurality of second grooves, respectively, formed in an external surface of said cylindrically shaped wall and said slanted wall of said conically shaped extension member, said cooling channels being disposed in said first grooves and sealed with a sealant material, wherein a ratio of (the number if the cooling channels x width of each cooling channel) to a circumferential length of said at least one end of said cylindrical portion of said at least first holder housing ranges between 30% and 80%.

\* \* \* \* \*